US012660328B2

(12) United States Patent
Yu et al.

(10) Patent No.: US 12,660,328 B2
(45) Date of Patent: Jun. 16, 2026

(54) INTEGRATED CIRCUIT INCLUDING STANDARD CELL AND METHOD OF FABRICATING THE SAME

(71) Applicant: SAMSUNG ELECTRONICS CO., LTD., Suwon-si (KR)

(72) Inventors: Jisu Yu, Seoul (KR); Woojin Rim, Hwaseong-si (KR); Jungho Do, Hwaseong-si (KR); Jaewoo Seo, Seoul (KR); Hyeongyu You, Hwaseong-si (KR); Minjae Jeong, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1020 days.

(21) Appl. No.: 17/846,606

(22) Filed: Jun. 22, 2022

(65) Prior Publication Data

US 2023/0040733 A1 Feb. 9, 2023

(30) Foreign Application Priority Data

Aug. 6, 2021 (KR) ........................ 10-2021-0104206

(51) Int. Cl.
H10D 89/10 (2025.01)
H10D 30/43 (2025.01)
(Continued)

(52) U.S. Cl.
CPC ............. H10D 89/10 (2025.01); H10D 30/43 (2025.01); H10D 62/121 (2025.01);
(Continued)

(58) Field of Classification Search
CPC .. H10D 84/85; H10D 30/014; H10D 30/6735; H10D 30/6757; H10D 84/0158;
(Continued)

(56) References Cited

U.S. PATENT DOCUMENTS 8,490,038 B1 7/2013 Arora et al.
10,096,522 B2 10/2018 Yang et al.
(Continued)

FOREIGN PATENT DOCUMENTS

KR 10 2020 0053757 A 5/2020

OTHER PUBLICATIONS

Communication dated Aug. 18, 2025 issued by the Korean Intellectual Property Office in Korean Patent Application No. 10-2021-0104206.

*Primary Examiner* — Britt Hanley
*Assistant Examiner* — Victor V Barzykin
(74) *Attorney, Agent, or Firm* — Sughrue Mion, PLLC

(57) ABSTRACT

Provided is an integrated circuit including standard cells arranged over a plurality of rows. The standard cells may include: a plurality of functional cells each implemented as a logic circuit; and a plurality of filler cells including at least one first filler cell and at least one second filler cell that each include at least one pattern from among a back end of line (BEOL) pattern, a middle of line (MOL) pattern, and a front end of line (FEOL) pattern, and wherein the at least one first filler cell and the at least one second filler cell have a same size as each other, and a density of one of the at least one pattern of the at least one first filler cell is different from a density of one of the at least one pattern of the at least one second filler cell.

10 Claims, 23 Drawing Sheets

(51) Int. Cl.

| | |
|---|---|
| *H10D 62/10* | (2025.01) |
| *H10D 84/01* | (2026.01) |
| *H10D 84/03* | (2025.01) |
| *H10D 84/83* | (2025.01) |
| *H10D 84/85* | (2025.01) |
| *B82Y 10/00* | (2011.01) |
| *G06F 30/392* | (2020.01) |
| *G06F 30/394* | (2020.01) |
| *H10D 30/01* | (2025.01) |
| *H10D 30/67* | (2025.01) |

(52) U.S. Cl.
CPC ..... *H10D 84/0149* (2025.01); *H10D 84/0186* (2025.01); *H10D 84/038* (2025.01); *H10D 84/834* (2025.01); *H10D 84/85* (2025.01); *B82Y 10/00* (2013.01); *G06F 30/392* (2020.01); *G06F 30/394* (2020.01); *H10D 30/014* (2025.01); *H10D 30/6735* (2025.01); *H10D 30/6757* (2025.01); *H10D 84/0158* (2025.01); *H10D 84/0193* (2025.01)

(58) Field of Classification Search
CPC .. H10D 84/0193; H10D 30/43; H10D 62/121; H10D 84/0149; H10D 84/0186; H10D 89/10; B82Y 10/00; G06F 30/392; G06F 30/394

See application file for complete search history.

(56) References Cited

U.S. PATENT DOCUMENTS

| | | | |
|---|---|---|---|
| 10,289,790 B2 | 5/2019 | Heilprin et al. | |
| 10,553,575 B2 | 2/2020 | Tien et al. | |
| 10,593,604 B1 * | 3/2020 | Lam | H01L 22/12 |
| 10,678,988 B2 | 6/2020 | Correale et al. | |
| 10,726,186 B2 | 7/2020 | Kim et al. | |
| 10,817,640 B2 | 10/2020 | Kim et al. | |
| 10,922,466 B2 | 2/2021 | Chuang et al. | |
| 2007/0096154 A1 | 5/2007 | Shimbo et al. | |
| 2018/0365368 A1 * | 12/2018 | Do | G06F 30/398 |
| 2019/0138682 A1 | 5/2019 | Correale, Jr. et al. | |
| 2019/0392110 A1 * | 12/2019 | Huda | H10D 89/10 |
| 2020/0411503 A1 | 12/2020 | Chang et al. | |
| 2021/0165947 A1 | 6/2021 | Park et al. | |
| 2021/0334449 A1 | 10/2021 | Yu et al. | |

* cited by examiner

: Substrate
: Cell Boundary
: Power Rail
: Gate Line
: Active Pattern
: Active Region
: Diffusion Break
: Contact <u>710</u>

M1

720

| | |
|---|---|
| ☐ | : Substrate |
| ⌐⌐ | : Cell Boundary |
| ⊠ | : Power Rail |
| ⧄ | : Gate Line |
| ⬓ | : Active Region |
| ⧄ | : Diffusion Break |
| ⬓ | : Contact |
| ⊠ | : Via |
| ⧄ | : M1 |

1300

1

INTEGRATED CIRCUIT INCLUDING STANDARD CELL AND METHOD OF FABRICATING THE SAME

CROSS-REFERENCE TO THE RELATED APPLICATION

This application is based on and claims priority under 35 U.S.C. § 119 to Korean Patent Application No. 10-2021-0104206, filed on Aug. 6, 2021, in the Korean Intellectual Property Office, the disclosure of which is incorporated by reference herein in its entirety.

BACKGROUND

Embodiments of the present disclosure relate to an integrated circuit, and more particularly, to an integrated circuit including a standard cell, and a method of fabricating the integrated circuit.

The integrated circuit may be designed based on standard cells. Specifically, a layout of the integrated circuit may be generated by placing the standard cells according to data defining the integrated circuit and routing the arranged standard cells. As a semiconductor manufacturing process is miniaturized, the size of patterns in the standard cell may decrease, and a design of the integrated circuit may become more complex. However, as the design of the integrated circuit becomes more complex, densities of the patterns may not be uniform, and this may cause a problem in a process.

SUMMARY

According to embodiments of the present disclosure, an integrated circuit including a standard cell is provided, and a method of fabricating the integrated circuit considering a density of a pattern included in the standard cell is provided.

According to embodiments, an integrated circuit including standard cells arranged over a plurality of rows is provided. The standard cells include: a plurality of functional cells each implemented as a logic circuit; and a plurality of filler cells including at least one first filler cell and at least one second filler cell that each include at least one pattern from among a back end of line (BEOL) pattern, a middle of line (MOL) pattern, and a front end of line (FEOL) pattern, and wherein the at least one first filler cell and the at least one second filler cell have a same size as each other, and a density of one of the at least one pattern of the at least one first filler cell is different from a density of one of the at least one pattern of the at least one second filler cell.

According to embodiments, a method of fabricating an integrated circuit is provided. The method includes: arranging standard cells by referring to a standard cell library, that includes information about a standard cell, and routing the standard cells that are arranged; arranging a filler cell of a selected type from among a plurality of filler cells to adjust a density of a pattern formed on at least one of the standard cells; and generating layout data based on the standard cells, including the filler cell, that are arranged, wherein the standard cell library includes data defining the plurality of filler cells, wherein the plurality of filler cells include a first filler cell and a second filler cell that each include at least one pattern from among a back end of line (BEOL) pattern, a middle of line (MOL) pattern, and a front end of line (FEOL) pattern, and wherein a density of one of the at least one pattern of the first filler cell is different from a density of one of the at least one pattern of the second filler cell.

According to embodiments, an integrated circuit including standard cells arranged over a plurality of rows is provided. The integrated circuit includes: a plurality of functional cells each implemented as a logic circuit; and a plurality of filler cells including at least one density supplementary filler cell that includes at least one pattern from among a back end of line (BEOL) pattern, a middle of line (MOL) pattern, and a front end of line (FEOL) pattern, wherein the at least one density supplementary filler cell is configured to satisfy a density rule of any one of the at least one pattern in the integrated circuit.

BRIEF DESCRIPTION OF THE DRAWINGS

Embodiments of the present disclosure will be more clearly understood from the following detailed description taken in conjunction with the accompanying drawings in which.

DETAILED DESCRIPTION OF THE EMBODIMENTS

The drawings attached to the present specification may not fit to scale for convenience of illustration, and elements may be exaggerated or reduced.

Figure 1:
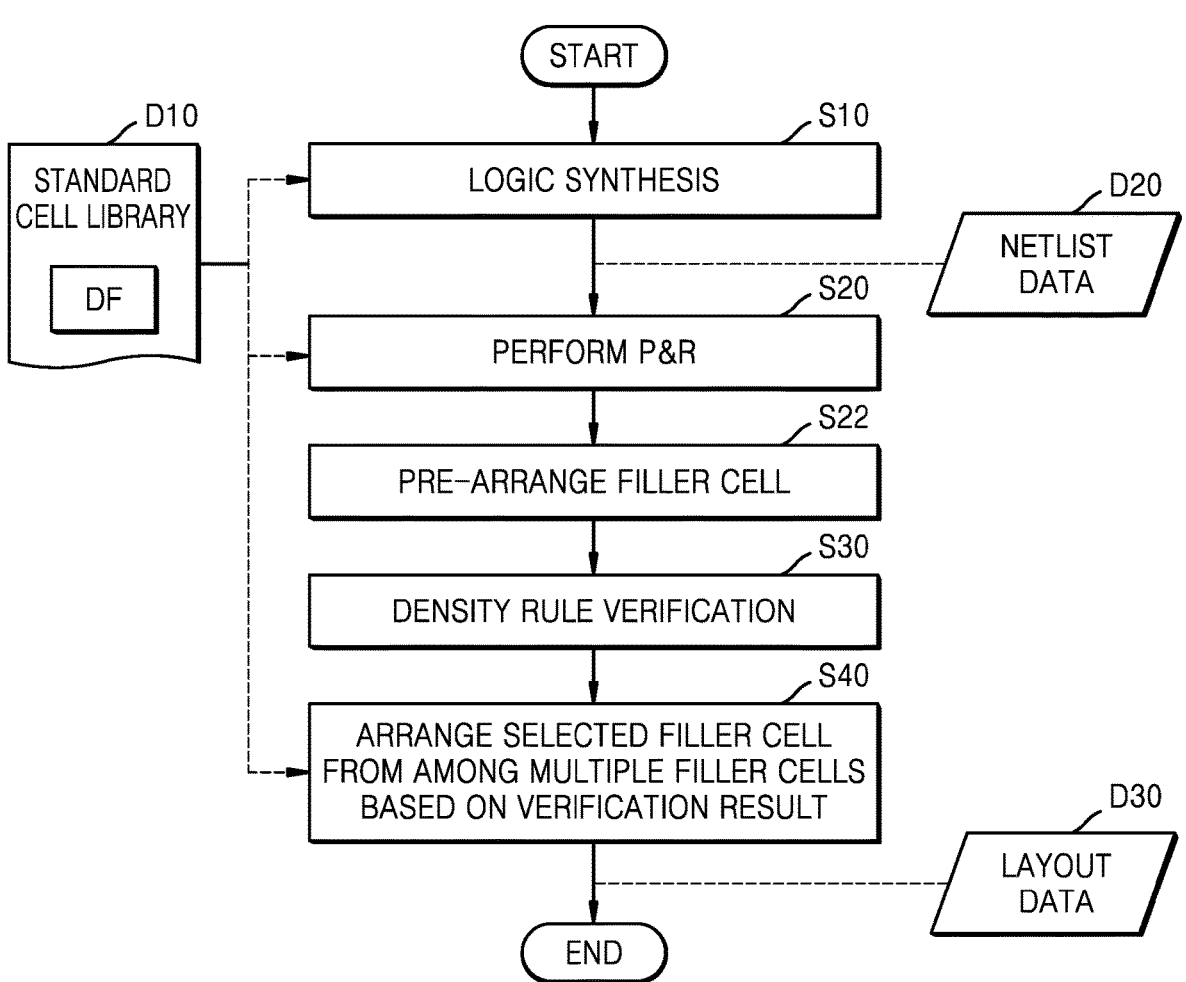
FIG. 1 is a flowchart schematically illustrating a method of designing an integrated circuit, according to an embodiment of the present disclosure.

FIG. 1 is a flowchart schematically illustrating a method of designing an integrated circuit, according to an embodiment of the present disclosure.

Referring to FIG. 1, a standard cell library D10 may include information about a standard cell, for example, functional information, characteristic information, layout information, and the like. The standard cell is a unit of a layout included in an integrated circuit, and the integrated circuit may include a plurality of different standard cells. For example, the integrated circuit may include a functional cell and a filler cell. The functional cell may be a standard cell in which a logic element (for example, an inverter, a flip-flop, a logic gate, etc.) corresponding to the functional cell is formed. The filler cell may be arranged adjacent to the functional cell to provide a space for routing signals provided to or output from the functional cell. In addition, the filler cell may be a cell used to fill a remaining space after functional cells are arranged.

In an embodiment, the standard cell library D10 may include data DF defining a layout of a plurality of filler cells. For example, the data DF may include data defining a structure of a first filler cell in which a relatively high-density middle of line (MOL) pattern is formed, and may include data defining a structure of a second filler cell in which a relatively low-density MOL pattern is formed. For example, the data DF may include data defining a structure of at least one of filler cells described with reference to FIGS. 3A to 11B. In an embodiment, the first filler cell and the second filler cell may have different MOL patterns from each other, but may have the same front end of line (FEOL) pattern. In an embodiment, the first filler cell and the second filler cell may have the same back end of line (BEOL) pattern.

In operation S10, a logic synthesis operation for generating gate-level netlist data from input data defined in a Register Transfer Level (RTL) may be performed. For example, a semiconductor design tool (for example, a logic synthesis tool) may perform logic synthesis by referring to the standard cell library D10 from RTL data written in Hardware Description Language (HDL) such as Very High Speed Integrated Circuit (VHSIC) Hardware Description Language (VHDL) and Verilog, to generate netlist data D20 including a bitstream or a netlist. The standard cell library D10 may include information about a plurality of standard cells, and the standard cells may be included in the integrated circuit by referring to the information in a logic synthesis process.

In operation S20, a Place & Routing (P&R) operation for generating layout data D30 from the netlist data D20 may be performed. The layout data D30 may have a format such as Graphic Design System II (GDSII), and may include geometric information of the standard cells and interconnections thereof. The layout data D30 may include geometric information about the standard cells and lines. The standard cells may have a structure conforming to a preset standard, and may be arranged in a plurality of rows. The layout data D30 may be generated by performing operations S20 to S40.

For example, the semiconductor design tool (for example, a P&R tool) may place a plurality of standard cells by referring to the standard cell library D10 from the netlist data D20. The semiconductor design tool may select one of layouts of standard cells defined by the netlist data D20 by referring to the standard cell library D10 and place the selected layout of the standard cells.

At operation S22, filler cells generated to satisfy a density rule of a specific pattern may be pre-placed. The filler cells may be density supplementary filler cells. For example, when N or more metal cuts are to be included within a certain radius, the density supplementary filler cell may be generated to include N or more metal cuts, and may be uniformly placed.

At operation S30, density rule verification may be performed. For example, the verification may be performed by a Design Rule Check (DRC) tool, and the density rule verification operation may be included in a DRC operation. Verification result data may be output from the DRC tool as an output file. The density rule verification operation may include, for example, a density rule verification operation of an FEOL pattern, a density rule verification operation of an MOL pattern, and a density rule verification operation of a BEOL pattern. Specifically, at operation S30, an operation of verifying a density rule of a contact or contact cut formed in the MOL pattern may be performed.

In operation S30, verification such as a DRC operation, Layout Versus Schematic (LVS), or Electrical Rule Check (ERC) may be further performed in addition to the density rule verification operation. Depending on a result of the verification performed at operation S30, operation S20 may be performed again.

According to the result of the verification performed at operation S30, an operation of placing a filler cell selected from among the first filler cell, the second filler cell, and filler cells of various types may be performed at operation S40. As operation S40 is performed, the layout data D30 may be re-generated.

For example, at operation S40, an operation of placing the second filler cell may be performed in an area where a density of the MOL pattern (for example, a density of contacts or contact cuts formed in the MOL pattern) is relatively high, and an operation of placing the first filler cell may be performed in an area where a density of the MOL pattern (for example, a density of contacts or contact cuts formed in the MOL pattern) is relatively low.

The first filler cell and the second filler cell may have different densities of MOL pattern. In an embodiment, the first filler cell and the second filler cell may differ from each other with respect to the density of a contact formed in the MOL pattern. For example, a density of a contact of the first filler cell having the MOL pattern may have a first value, a density of a contact of the second filler cell having the MOL pattern may have a second value, and the first value may be greater than the second value. In an embodiment, a contact having the MOL pattern may not be formed in the second filler cell. In other words, in the second filler cell, a density of a contact formed in the MOL pattern may be 0. In an embodiment, the first filler cell and the second filler cell may differ from each other with respect to the density of a contact having the MOL pattern, and the density of contact may be adjusted through arrangement of the first filler cell and the second filler cell. However, embodiments of the present disclosure are not limited thereto, and the filler cells may be generated to adjust densities of various patterns included in the BEOL pattern, the FEOL pattern, and the MOL pattern.

In a method of designing an integrated circuit according to an embodiment of the present disclosure, to satisfy a density rule for a pattern included in the integrated circuit, a density supplementary filler cell may be pre-arranged or a plurality of filler cells having various densities for each pattern may be selectively arranged. Through the method of designing the integrated circuit according to the embodiment of the present disclosure, the integrated circuit may be effectively designed.

Figure 2:
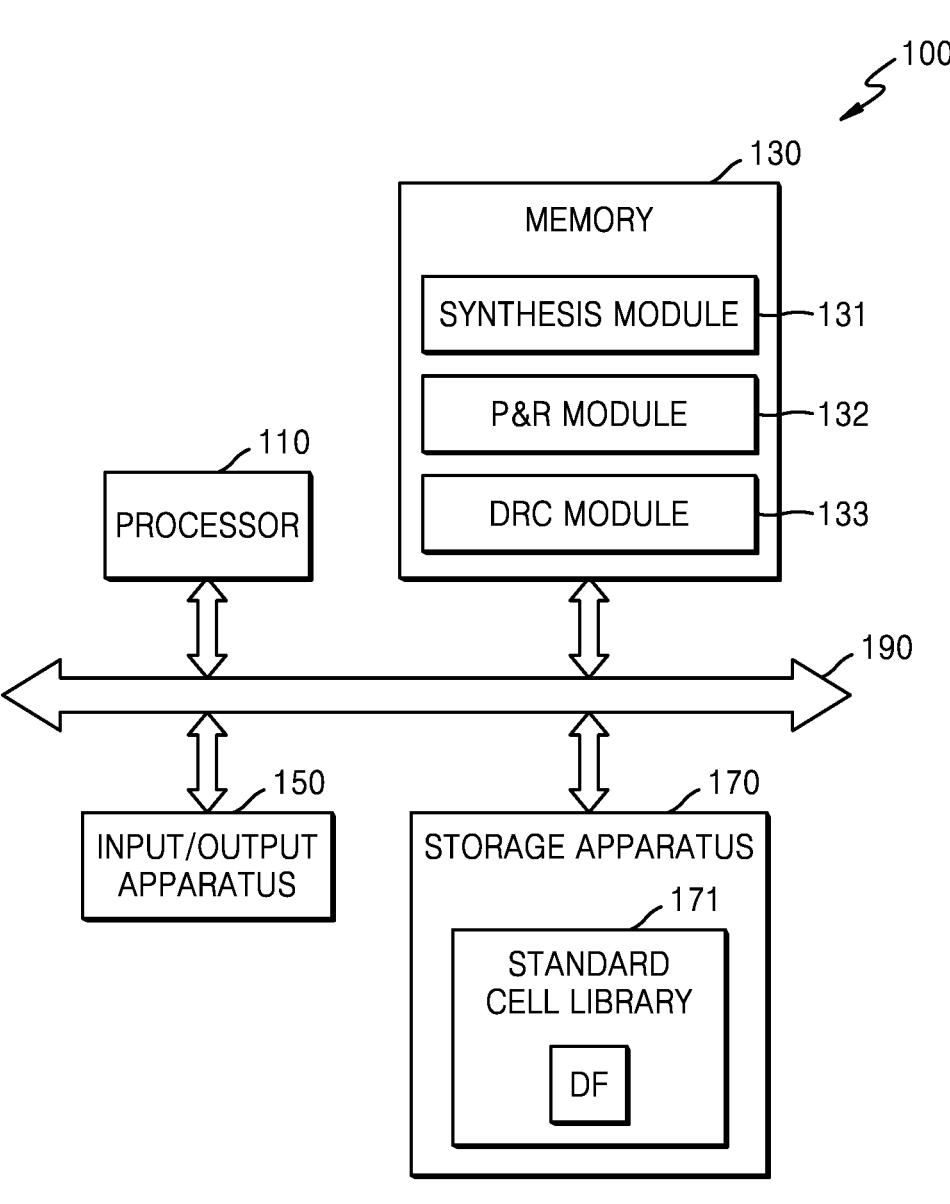
FIG. 2 is a block diagram of a computing system for designing an integrated circuit, according to an embodiment of the present disclosure.

FIG. 2 is a block diagram of a computing system for designing an integrated circuit, according to an embodiment of the present disclosure.

Referring to FIG. 2, a computing system for designing an integrated circuit (hereinafter, referred to as "an integrated circuit design system 100") may include a processor 110, a memory 130, an input/output apparatus 150, a storage apparatus 170, and a bus 190. The integrated circuit design system 100 may perform an integrated circuit design operation including operations S10 to S40 in FIG. 1. In an embodiment, the integrated circuit design system 100 may be implemented as an integrated device, and may thus be referred to as an integrated circuit design device. The integrated circuit design system 100 may be provided as an apparatus exclusive for designing an integrated circuit of a semiconductor apparatus, but may be a computer for driving various simulation tools or design tools. The integrated circuit design system 100 may be a fixed-type computing system such as desktop computers, workstations, and servers, or may be a portable computing system such as laptop computers.

The processor 110 may be configured to execute instructions for performing at least one of various operations for designing an integrated circuit. For example, the processor 110 may include a core capable of executing any instruction set (for example, Intel Architecture-32 (IA-32), 64-bit extended IA-32, x86-64, PowerPC, Sparc, Microprocessor without Interlocked Pipeline Stages (MIPS), Advanced Reduced Instruction Set Computer (RISC) Machine (ARM), IA-64, etc.), such as a micro-processor, an application processor (AP), a digital signal processor (DSP), and a graphics processing unit (GPU). The processor 110 may communicate with the memory 130, the input/output apparatus 150, and the storage apparatus 170 via the bus 190. The processor 110 may drive a synthesis module 131, a P&R module 132, and a DRC module 133 that are loaded in the memory 130, to execute a design operation of an integrated circuit.

The memory 130 may store the synthesis module 131, the P&R module 132, and the DRC module 133. The synthesis module 131, the P&R module 132, and the DRC module 133 may be loaded into the memory 130 from the storage apparatus 170. The synthesis module 131 may include, for example, a program including a plurality of instructions for performing a logic synthesis operation according to operation S10 in FIG. 1. The P&R module 132 may include, for example, a program including a plurality of instructions for performing a layout design operation according to operations S20 and S40 in FIG. 1.

The DRC module 133 may determine whether a design rule error occurs. The DRC module 133 may include, for example, a program including a plurality of instructions for performing a DRC operation including a density rule verification operation according to operation S30 in FIG. 1. When there is a design rule violation, the P&R module 132 may adjust a layout of arranged cells. When there is no design rule error, a layout design of the integrated circuit may be completed.

The memory 130 may be a volatile memory such as static random access memory (RAM) (SRAM) or dynamic RAM (DRAM), or may be a non-volatile memory such as phase change RAM (PRAM), resistive RAM (ReRAM), nano floating gate memory (NFGM), polymer RAM (PoRAM), magnetic RAM (MRAM), and flash memory.

The input/output apparatus 150 may control a user input and a user output from user interface apparatuses. For example, the input/output apparatus 150 may include an input apparatus such as a keyboard, a mouse, and a touch-pad, to receive input data defining the integrated circuit, or the like. For example, the input/output apparatus 150 may include an output apparatus such as a display and a speaker, and may display a placement result, a routing result, layout data, a DRC result, or the like.

The storage apparatus 170 may store a program of the synthesis module 131, the P&R module 132, and the DRC module 133, and the program or at least a portion thereof may be loaded into the memory 130 before the program is executed by the processor 110. The storage apparatus 170 may also store data to be processed by the processor 110 or may store data that has already been processed by the processor 110. For example, the storage apparatus 170 may store data to be processed by the program of the synthesis module 131, the P&R module 132, and the DRC module 133, (for example, a standard cell library 171, netlist data, etc.) and data generated by the program (for example, a DRC result, layout data, etc.). The standard cell library 171 stored in the storage apparatus 170 may be the standard cell library D10 of FIG. 1.

For example, the storage apparatus 170 may include a non-volatile memory such as electrically erasable programmable read-only memory (ROM) (EEPROM), flash memory, PRAM, RRAM, MRAM, and FRAM, and may include a storage medium such as a memory card (a MultiMediaCard (MMC), an embedded MMC (eMMC), a Secure Digital (SD) card, a MicroSD card, etc.), a solid state drive (SSD), a hard disk drive (HDD), magnetic tape, an optical disk, and a magnetic disk. In addition, the storage apparatus 170 may be detachable from the integrated circuit design system 100.

Figure 3A:
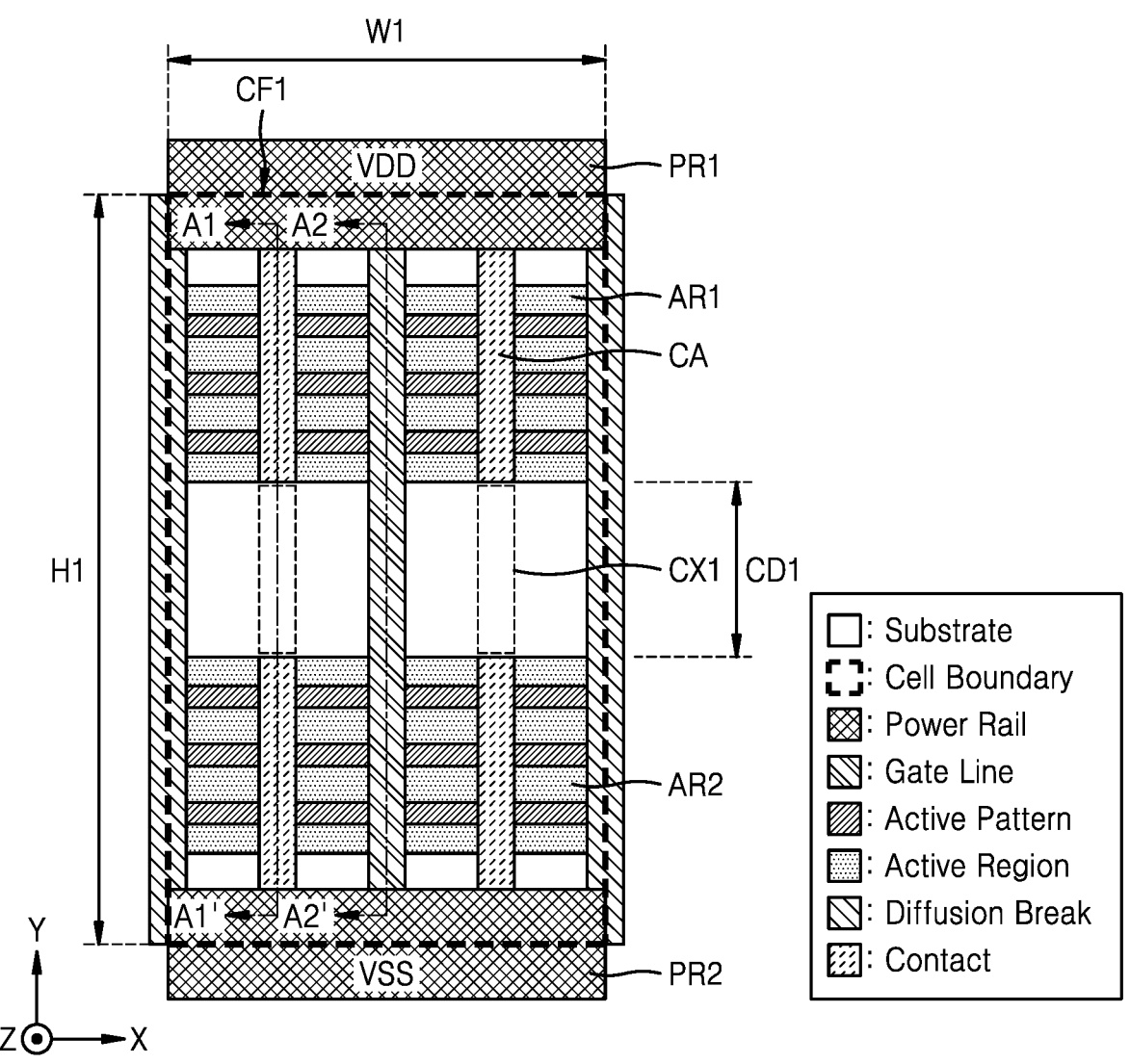
FIG. 3A is a diagram illustrating a layout of a filler cell included in an integrated circuit, according to an embodiment of the present disclosure.
Figure 3B:
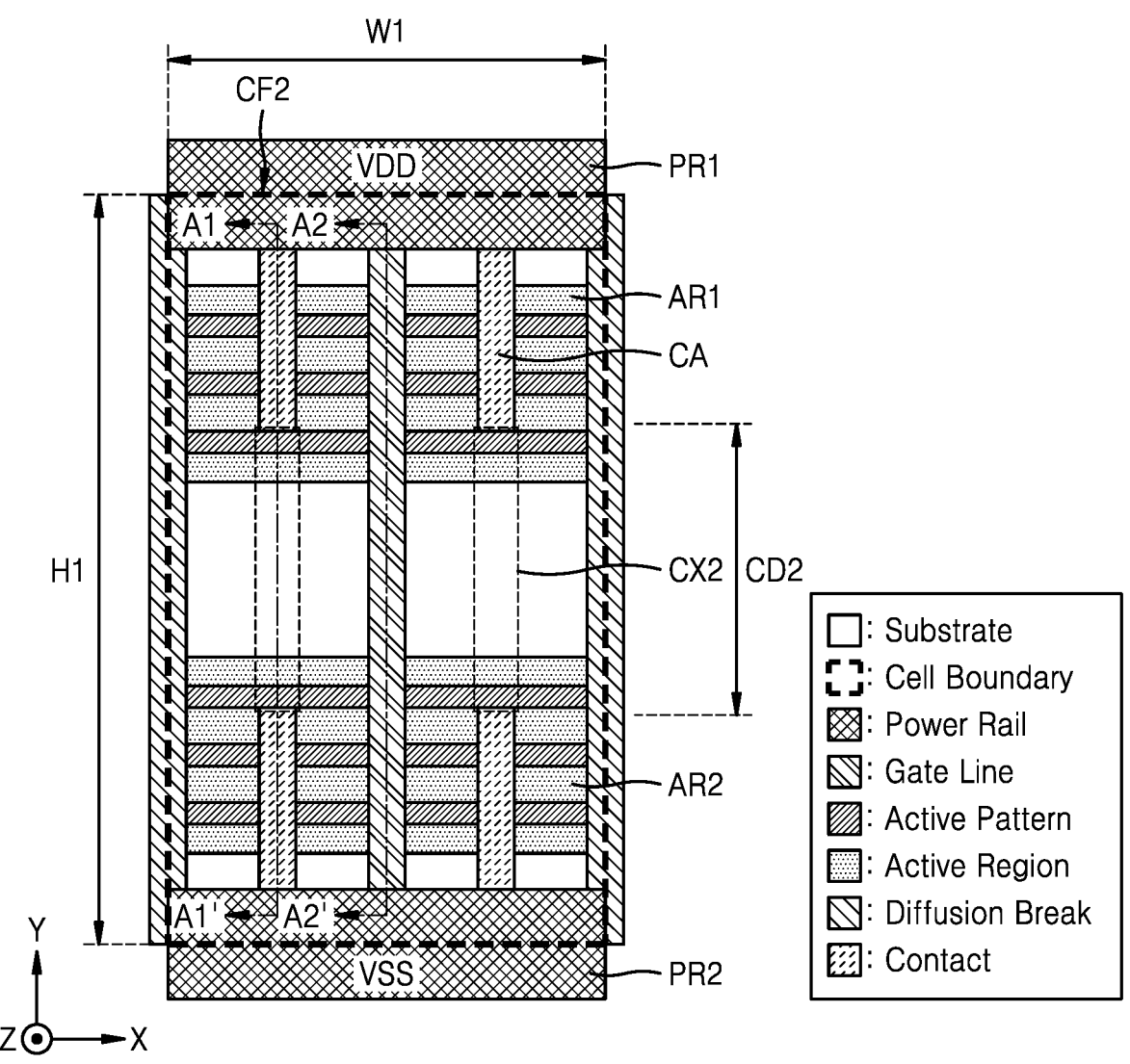
FIG. 3B is a diagram illustrating a layout of a filler cell included in an integrated circuit, according to an embodiment of the present disclosure.
Figure 4A:
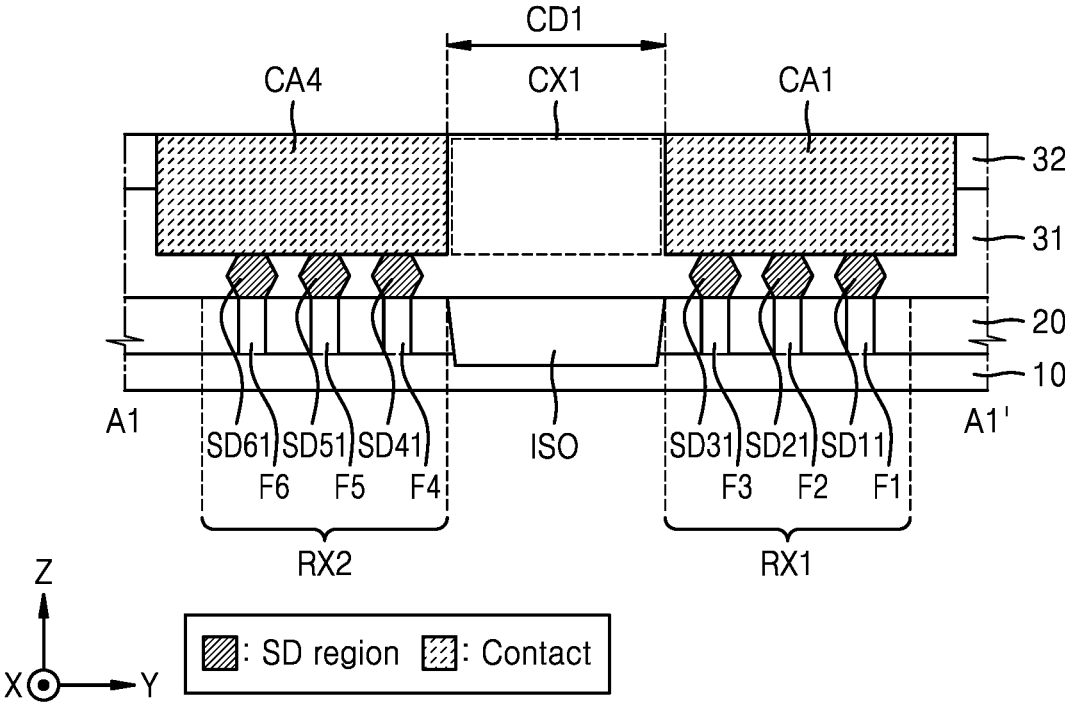
FIG. 4A is a cross-sectional view of a filler cell included in an integrated circuit according to an embodiment of the present disclosure, taken along line A1-A1' in FIG. 3A.
Figure 4B:
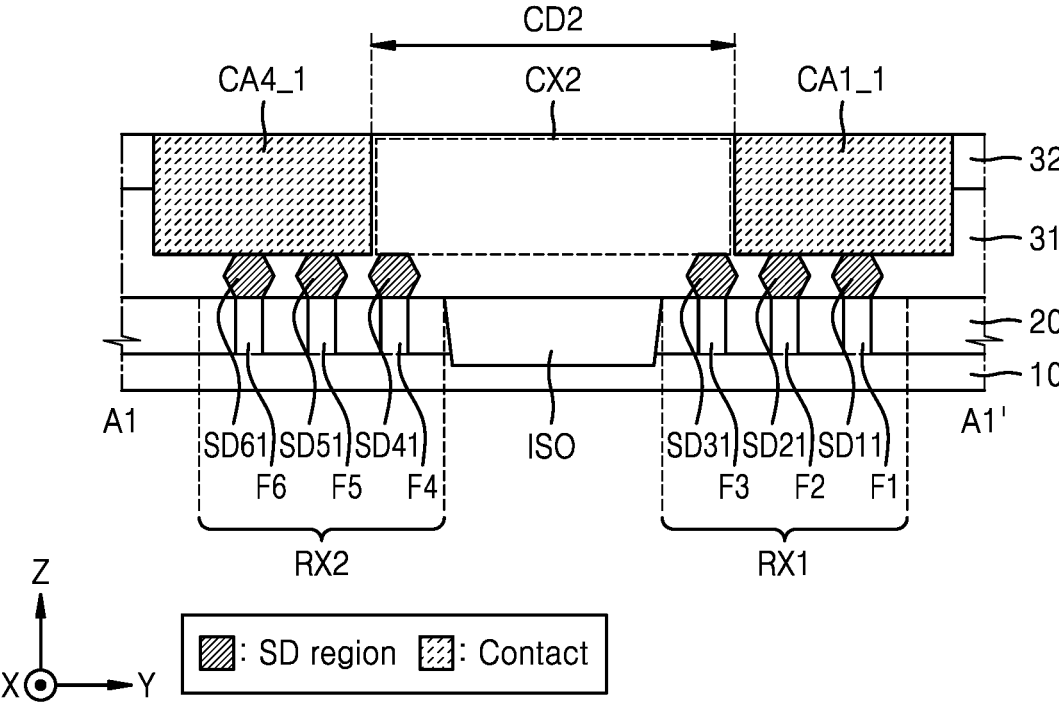
FIG. 4B is a cross-sectional view of a filler cell included in an integrated circuit according to an embodiment of the present disclosure, taken along line A1-A1' in FIG. 3B.
Figure 4C:
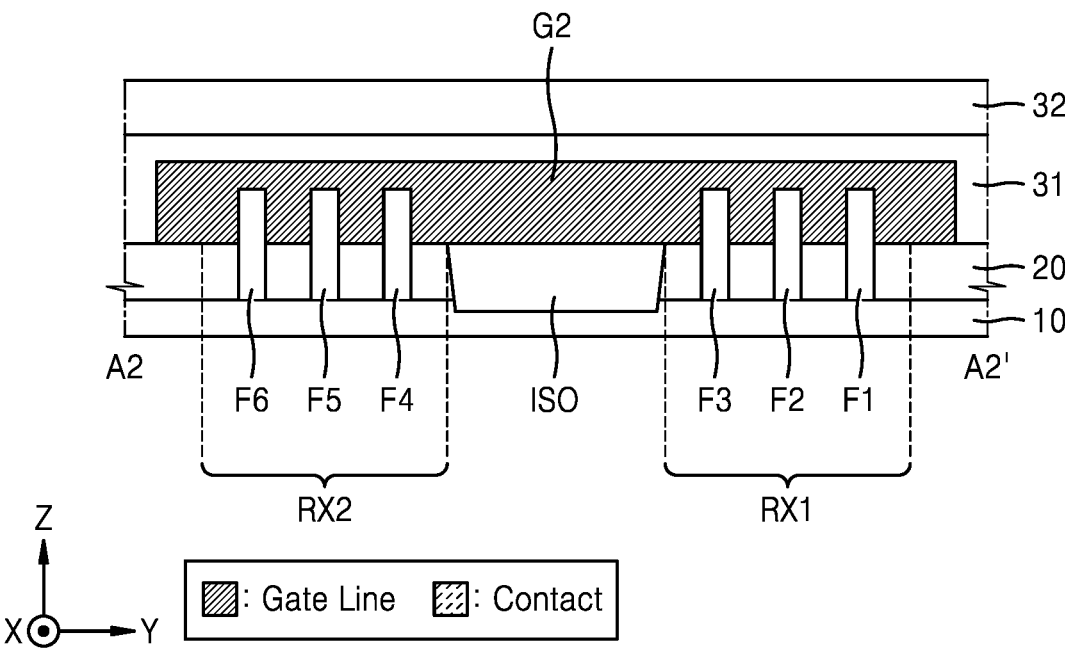
FIG. 4C is a cross-section view of a filler cell included in an integrated circuit according to an embodiment of the present disclosure, taken along line A2-A2' in FIG. 3A.
Figure 4D:
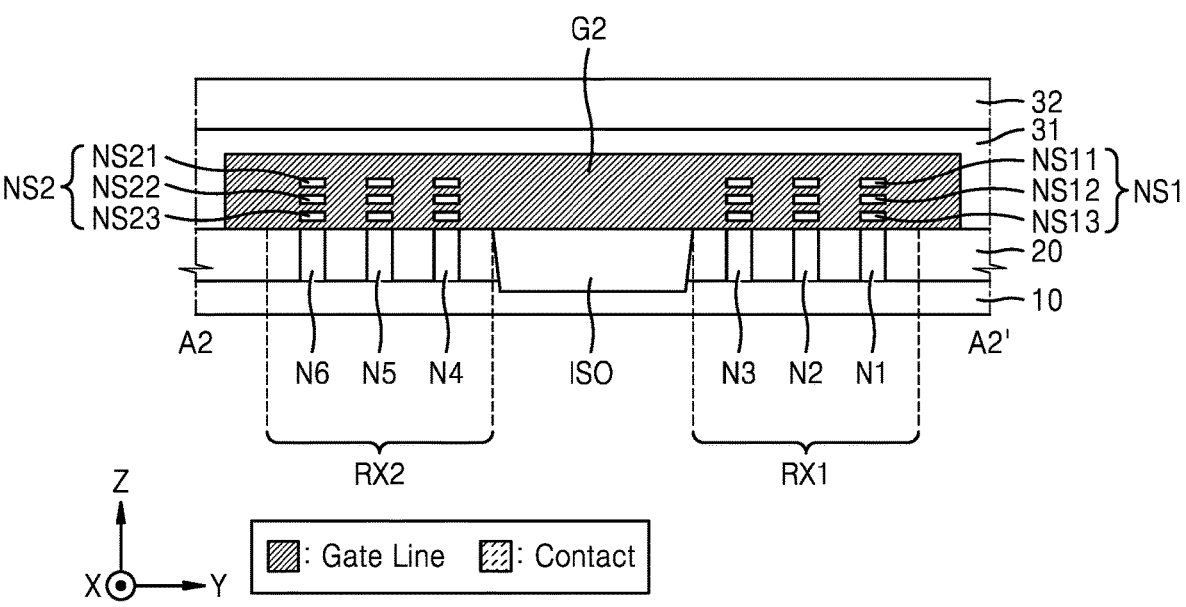
FIG. 4D is a cross-section view of a filler cell included in an integrated circuit according to an embodiment of the present disclosure, taken along line A2-A2' in FIG. 3A.

FIGS. 3A and 3B are diagrams illustrating a layout of a filler cell included in an integrated circuit, according to an embodiment of the present disclosure. FIGS. 4A and 4B are cross-sectional views of a filler cell included in an integrated circuit according to an embodiment of the present disclosure, taken along line A1-A1' in FIG. 3A and line A1-A1' in FIG. 3B, respectively. FIGS. 4C and 4D are cross-sectional views of a filler cell included in an integrated circuit according to an embodiment of the present disclosure, taken along line A2-A2' in FIG. 3A.

A first filler cell CF1 shown in FIG. 3A and a second filler cell CF2 shown in FIG. 3B are examples of filler cells of which a density of any one of patterns of a line layer is different from another one so as to satisfy a density rule.

In the drawings of the present specification, for convenience of illustration, only some layers may be shown, and in order to show a connection between a pattern of the line layer and a sub-pattern thereof, a via may be indicated even though the via is arranged below the pattern of the line layer. In addition, a pattern including a conductive material, such as the pattern of the line layer, may be referred to as a conductive pattern, or may simply be referred to as a pattern.

In the present specification, a plane including an X-axis and a Y-axis may be referred to as a horizontal plane, and an element arranged in a relatively +Z-axis direction compared to another element may be understood as being above the other element, and an element arranged in a relatively −Z-axis direction compared to another element may be understood as being below the other element. In the drawings of the present specification, only some layers may be shown, for convenience of illustration.

Referring to FIG. 3A, the integrated circuit may include the first filler cell CF1 defined by a cell boundary. The first filler cell CF1 may have a first length W1 in the X-axis direction, and may have a first height H1 in the Y-axis direction.

The first filler cell CF1 may include a plurality of active regions extending parallel to each other in the X-axis direction. For example, the first filler cell CF1 may include a first active region AR1 and a second active region AR2.

In an embodiment, a plurality of fins may be formed in each of the first active region AR1 and the second active region AR2. Alternatively, in an example embodiment, a plurality of nanowires may be formed in each of the first active region AR1 and the second active region AR2, and alternatively, in an example embodiment, a nanosheet may be formed in each of the first active region AR1 and the second active region AR2. In FIG. 3A, a plurality of fins, a plurality of nanowires, or a nanosheet may be formed in portions indicated as an active pattern.

For example, the first active region AR1 and the second active region AR2 may each include a semiconductor such as silicon (Si) or germanium (Ge), or a compound semiconductor such as silicon-germanium (SiGe), silicon carbide (SiC), gallium arsenide (GaAs), indium arsenide (InAs), or indium phosphide (InP). Alternatively, the first active region AR1 and the second active region AR2 may each include a conductive region, for example, a well doped with impurities or a structure doped with impurities. For example, the first active region AR1 may include an n-well formed on a substrate and doped with n-type impurities, and the second active region AR2 may include a substrate doped with p-type impurities. Alternatively, the second active region AR2 may include a p-well doped with p-type impurities.

The first filler cell CF1 may include at least one gate line extending in the Y-axis direction. The gate line may be arranged in the first active region AR1 and the second active region AR2. The gate line may constitute a transistor with each of the first active region AR1 and the second active region AR2. For example, the gate line may constitute a p-channel metal-oxide-semiconductor (PMOS) transistor with the first active region AR1, and the gate line may constitute an n-channel metal-oxide-semiconductor (NMOS) transistor with the second active region AR2. The gate line may include a metal material such as tungsten (W) and tantalum (Ta), a nitride thereof, a silicide thereof, or doped polysilicon.

A first power rail PR1 may be arranged in a cell boundary in the Y-axis direction of the first filler cell CF1, and the second power rail PR2 may be arranged in a cell boundary in a −Y-axis direction of the first filler cell CF1. The first power rail PR1 and the second power rail PR2 may each extend in the X-axis direction. In the drawings, it is shown that the first power rail PR1 and the second power rail PR2 are arranged in cell boundaries parallel to the X-axis direction of the first filler cell CF1. However, embodiments of the present disclosure are not limited thereto, and at least one of the first power rail PR1 and the second power rail PR2 may be arranged within the first filler cell CF1.

A positive power voltage VDD may be applied to the first power rail PR1, and a ground voltage or a negative power voltage VSS may be applied to the second power rail PR2. Semiconductor elements formed in the first filler cell CF1 may be electrically separated from the first power rail PR1 and the second power rail PR2.

The first filler cell CF1 may include at least one contact CA extending in the Y-axis direction. The contact CA may be arranged in the first active region AR1 and the second active region AR2. The contact CA may be electrically separated from the first power rail PR1 and the second power rail PR2. Accordingly, a transistor formed in the first filler cell CF1 may be floated.

The first filler cell CF1 may include a first contact cut CX1. The contact CA arranged in the first filler cell CF1 may be separated by the first contact cut CX1 and the first contact cut CX1 may extend by a first distance CD1 in the Y-axis direction.

A diffusion break may be formed at each of a cell boundary in the X-axis direction of the first filler cell CF1 and a cell boundary of a reverse direction of the X-axis direction. The diffusion break may electrically separate the first filler cell CF1 from other standard cells arranged adjacent to the first filler cell CF1. In an embodiment, the diffusion break may be a single diffusion break (SDB), but is not limited thereto, and the diffusion break may be a double diffusion break (DDB) depending on a structure.

In the description of FIG. 3B, descriptions already given above with reference to FIG. 3A are omitted. Referring to FIG. 3B, an integrated circuit may include the second filler cell CF2 defined by a cell boundary. The second filler cell CF2 may have a first length W1 in the X-axis direction, and may have a first height H1 in the Y-axis direction.

A second contact cut CX2 of the second filler cell CF2 may have a different length from that of the first contact cut CX1 of the first filler cell CF1 in, for example, the Y-axis direction.

The second filler cell CF2 may include at least one contact CA extending in the Y-axis direction. The contact CA may be arranged in the first active region AR1 and the second active region AR2. The contact CA may be electrically separated from the first power rail PR1 and the second power rail PR2. Accordingly, a transistor formed in the first filler cell CF1 may be floated.

The second filler cell CF2 may include a second contact cut CX2. The contact CA arranged in the second filler cell CF2 may be separated by the second contact cut CX2, and the second contact cut CX2 may extend by a second distance CD2 in the Y-axis direction.

For example, when an MOL pattern error occurs within a specific block, a filler cell may be swapped to satisfy a density rule. When a density of the contact CA in a specific block is greater than a reference value, the first filler cell CF1 may be replaced with the second filler cell CF2. When a density of the contact CA in a specific block is less than a reference value, the second filler cell CF2 may be replaced with the first filler cell CF1. In this case, the first filler cell CF1 and the second filler cell CF2 may include the same BEOL pattern, and only a density of a contact included in the first filler cell CF1 may be different from a density of a contact included in the second filler cell CF2.

In the first filler cell and the second filler cell, only a density of any one of a plurality of patterns included in a filler cell may be different, and the remaining patterns may be configured the same. For example, the first filler cell and the second filler cell may include the same FEOL pattern, and a density of a BEOL pattern included in the first filler cell may be different from a density of a BEOL pattern included in the second filler cell. The first filler cell and the second filler cell may have different MOL densities from each other while having the same BEOL pattern. The first filler cell and the second filler cell may have different numbers of MOL contacts from each other while having the same BEOL pattern. The first filler cell and the second filler cell may have different BEOL densities while having the same FEOL pattern. The first filler cell and the second filler cell may include a metal cut while having the same FEOL pattern.

FIGS. 4A and 4B are cross-sectional views of a filler cell included in an integrated circuit according to an embodiment of the present disclosure, taken along line A1-A1' in FIG. 3A and line A1-A1' in FIG. 3B, respectively.

Referring to FIG. 4A, a field insulation layer 20 may be formed on a substrate 10. The field insulation layer 20 may include, as a non-limiting example, silicon dioxide ($SiO_2$), silicon nitride (SiN), silicon oxynitride (SiON), silicon oxy-carbonitride (SiOCN), or a combination of two or more thereof. In some embodiments, the field insulation layer 20 may surround some of side surfaces of the active patterns, that is, fins, as shown in FIG. 3A. A first interlayer insulating layer 31, a second interlayer insulating layer 32, a third interlayer insulating layer (not shown), and a fourth interlayer insulating layer (not shown) may be formed on the field insulation layer 20. First to sixth fins (F1, F2, F3, F4, F5, and F6) may each extend in the X-axis direction from the field insulation layer 20, and first to sixth source/drain regions (SD11, SD21, SD31, SD41, SD51, and SD61) may be respectively formed on the first to sixth fins F1 to F6. A device separator ISO may extend in the X-axis direction between the first to third fins F1 to F3 and the fourth to sixth fins F4 to F6, and a first active region RX1 and a second active region RX2 may be separated from each other by the device separator ISO.

A first source/drain contact CA1 may be connected to the first to third source/drain regions SD11, SD21, and SD31 through the second interlayer insulating layer 32, and accordingly, the first to third source/drain regions SD11, SD21, and SD31 may be electrically connected to each other. A fourth source/drain contact CA4 may be connected to the fourth to sixth source/drain regions SD41, SD51, and SD61 through the second interlayer insulating layer 32, and accordingly, the fourth to sixth source/drain regions SD41, SD51, and SD61 may be electrically connected to each other. The first source/drain contact CA1 and the fourth source/drain contact CA4 may be separated from each other by the first contact cut CX1, and may be spaced apart from each other by the first distance CD1 by the first contact cut CX1 extending in the Y-axis direction.

In the description of FIG. 4B, descriptions already given above with reference to FIG. 4A are omitted. Referring to FIG. 4B, a first source/drain contact CA1_1 may be connected to the first to second source/drain regions SD11 and SD21 through the second interlayer insulating layer 32, and accordingly, the first to second source/drain regions SD11 and SD21 may be electrically connected to each other. In addition, a fourth source/drain contact CA4_1 may be connected to the fifth to sixth source/drain regions SD51 and SD61 through the second interlayer insulating layer 32, and accordingly, the fifth to sixth source/drain regions SD51 and SD61 may be electrically connected to each other. The first source/drain contact CA1_1 and the fourth source/drain contact CA4_1 may be separated from each other by a $1\_1^{st}$ contact cut CX2, and may be spaced apart by the second distance CD2 by the second contact cut CX2 extending in the Y-axis direction.

FIGS. 4C and 4D are cross-sectional views of a filler cell included in an integrated circuit according to an embodiment of the present disclosure, taken along line A2-A2' in FIG. 3A. Cross-sectional views of FIG. 4C and/or FIG. 4D may also be illustrative of a corresponding cross-section taken along line A2-A2' in FIG. 3B.

Although not shown in FIGS. 4C and 4D, a gate spacer may be formed on a side surface of a gate line, and a gate dielectric layer may be formed between the gate line and the gate spacer and on a lower surface of the gate line. In addition, a barrier layer may be formed on a surface of a contact and/or a via. Hereinafter, descriptions of FIG. 4C and FIG. 4D that are the same as each other are omitted.

In some embodiments, an integrated circuit may include a fin field-effect transistor (FinFET). Referring to FIG. 4C, the substrate 10 may include bulk silicon or a silicon-on-insulator (SOI), and may include, as a non-limiting example, SiGe, silicon germanium on insulator (SGOI), indium antimonide (InSb), lead telluride (PbTe) compounds, InAs, nitrides, GaAs, or gallium antimonide (GaSb). The field insulation layer 20 may be formed on the substrate 10. The field insulation layer 20 may include, as a non-limiting example, $SiO_2$, SiN, SiON, SiOCN, or a combination of two or more thereof. In some embodiments, the field insulation layer 20 may surround some of side surfaces of the active patterns, that is, fins, as shown in FIG. 4C. A first interlayer insulating layer 31, a second interlayer insulating layer 32, a third interlayer insulating layer (not shown), and a fourth interlayer insulating layer (not shown) may be formed on the field insulation layer 20.

The first to sixth fins F1 to F6 may each extend in the X-axis direction from the field insulation layer 20. The device separator ISO may extend in the X-axis direction between the first to third fins F1, F2, and F3 and the fourth to sixth fins F4, F5, and F6, and the first active region RX1 and the second active region RX2 may be separated from each other by the device separator ISO. The first to sixth fins F1 to F6 may penetrate through the field insulation layer 20 and may cross a gate line G2 extending in the Y-axis direction. In some embodiments, the integrated circuit may include a different number of fins from shown in FIG. 4C.

The gate line G2 may include, as a non-limiting example, titanium (Ti), Ta, W, aluminum (Al), cobalt (Co), or a combination of two or more thereof, or may include Si or SiGe that are not metals. In addition, the gate line G2 may be formed by stacking two or more conductive materials, and may include, for example, a work function control layer including titanium nitride (TiN), tantalum nitride (TaN), titanium carbide (TiC), tantalum carbide (TaC), titanium aluminum carbide (TiAlC), or a combination of two or more thereof, and a filling conductive layer including W or Al. A gate contact may be connected to the gate line G2 through the second interlayer insulating layer 32.

In some embodiments, the integrated circuit may include a transistor having a gate-all-around (GAA) structure in which a nanowire and/or a nanosheet are surrounded by a gate line. For example, as shown in FIG. 4D, a first fin active region N1 may extend in the Y-axis direction in the first active region RX1, and the integrated circuit may include a nanowire structure (NWS) formed at a position spaced apart in the Z-axis direction from the first fin active region N1. The NWS may include nanowires extending parallel to an upper surface of a fin-type active region. The nanowires may be sequentially stacked on the fin-type active region, and may each include a channel region. The nanowires may include the same material as the substrate 10. However, embodiments of the present disclosure are not limited thereto, and a nanosheet structure (NSS) may be formed at a position spaced apart in the Z-axis direction from the first fin active region N1. The first active area RX1 may extend over the first fin active region N1, a second fin active region N2, and a third fin active region N3, and a second active region RX2 may extend over a fourth fin active region N4, a fifth fin action region N5, and a sixth fin active region N6.

A first nanosheet stack NS1 including three nanosheets NS11, NS12, and NS13 in the first fin active region N1 may extend in the X-axis direction through the gate line G2. The first nanosheet stack NS1 may be doped with n-type impurities and may form a p-channel field-effect transistor (PFET). In addition, a second nanosheet stack NS2 including three nanosheets NS21, NS22, and NS23 in the sixth fin active region N6 may extend in the X-axis direction through the gate line G2. The second nanosheet stack NS2 may be doped with p-type impurities and may form an n-type field-effect transistor (NFET). In some embodiments, the integrated circuit may include a different number of fin active regions, a different number of nanosheet stacks, and a different number of nanosheets from shown in FIG. 4D.

Figure 5:
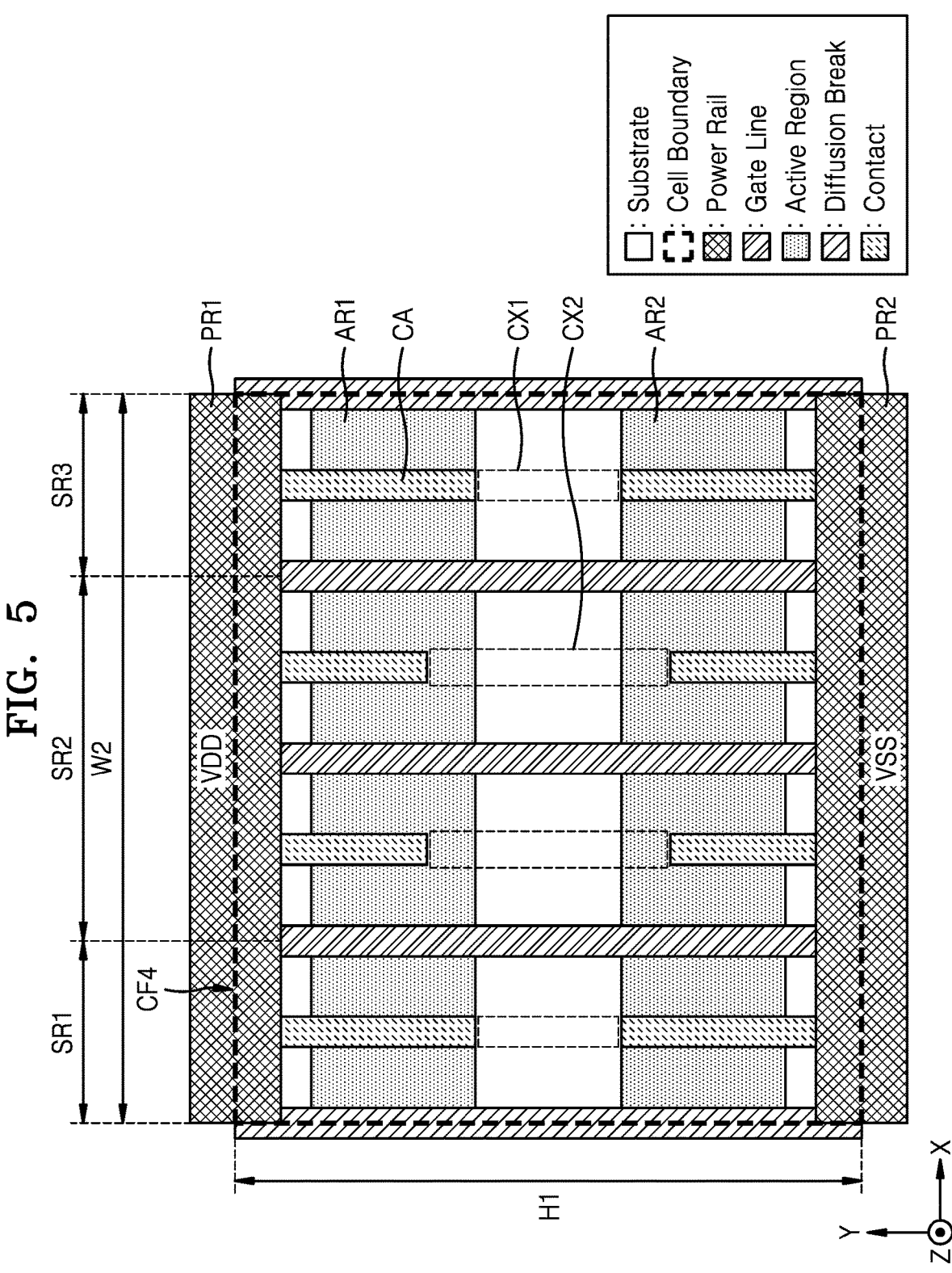
FIG. 5 is a diagram illustrating a layout of a filler cell included in an integrated circuit, according to an embodiment of the present disclosure.

FIG. 5 is a diagram illustrating a layout of a filler cell included in an integrated circuit, according to an embodiment of the present disclosure.

In the description of FIG. 5, descriptions already given above with reference to FIG. 3A are omitted. A fourth filler cell CF4 shown in FIG. 5 may include contact cuts having different lengths included in the first filler cell CF1 shown in FIG. 3A and the second filler cell CF2 shown in FIG. 3B.

The fourth filler cell CF4 may include a plurality of contacts CA extending in the Y-axis direction. The contacts CA may be arranged in the first active region AR1 and the second active region AR2. The contacts CA may be electrically separated from the first power rail PR1 and the second power rail PR2. Accordingly, a transistor formed in the fourth filler cell CF4 may be floated.

The fourth filler cell CF4 may include a first contact cut CX1 and a second contact cut CX2. The contacts CA arranged at a cell boundary of the fourth filler cell CF4 may be separated from each other by the first contact cut CX1, and the first contact cut CX1 may extend by a first distance in the Y-axis direction. Remaining contacts in the fourth filler cell CF4 excluding the contacts CA arranged at both cell boundaries in the X-axis direction may be separated from each other by the second contact cut CX2, and the second contact cut CX2 may extend by a second distance in the Y-axis direction.

For example, the fourth filler cell CF4 may extend over a first section SR1, a second section SR2, and a third section SR3 in a second direction perpendicular to a first direction. In the first section SR1 and the third section SR3, the fourth filler cell CF4 may include a first contact cut CX1 having a first length and extending in the first direction, and in the second section SR2, the fourth filler cell CF4 may include a second contact cut CX2 having a second length and extending in the first direction. The first length may be less than the second length.

Figure 6A:
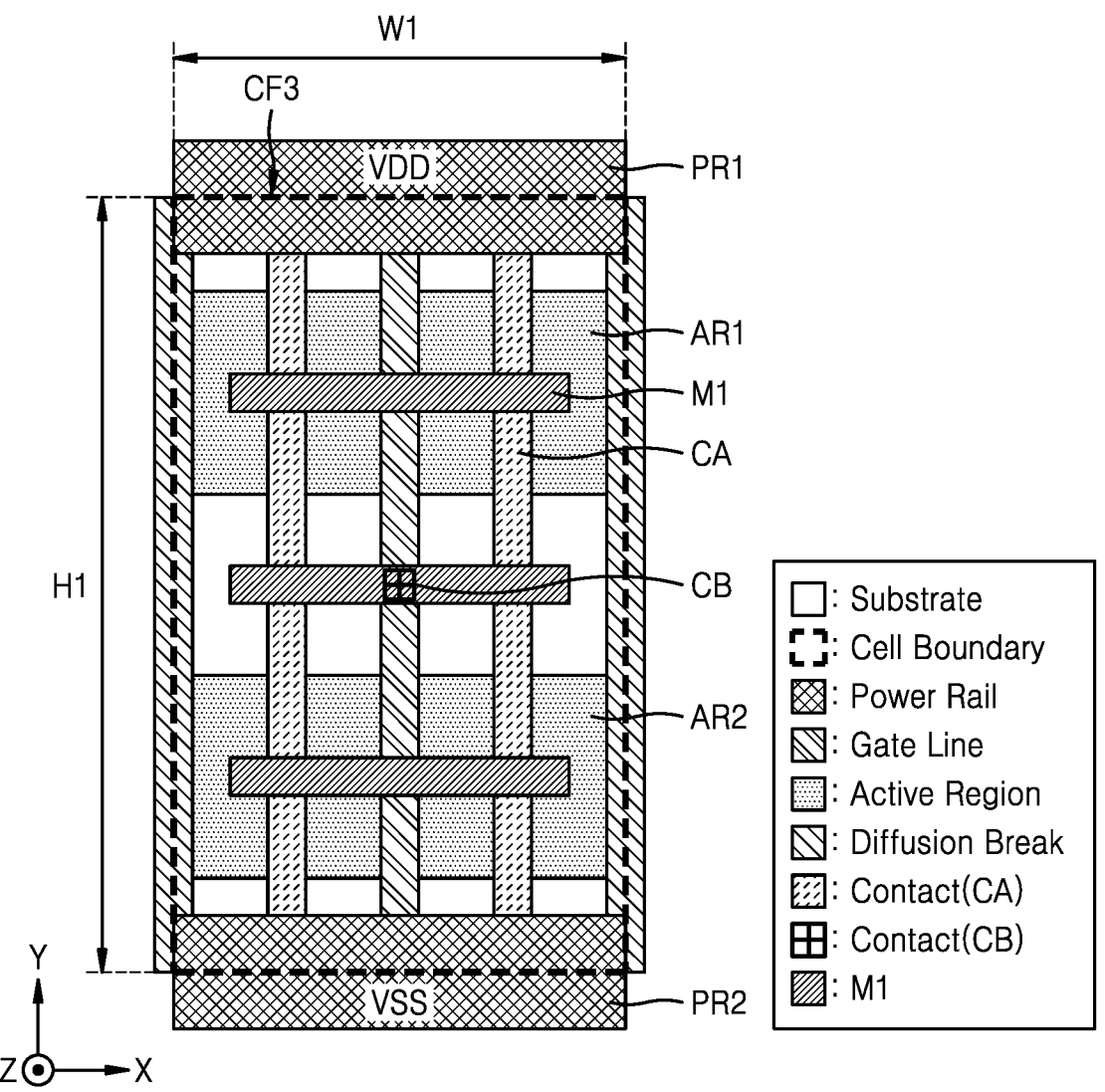
FIG. 6A is a diagram illustrating a layout of a filler cell included in an integrated circuit, according to an embodiment of the present disclosure.
Figure 6B:
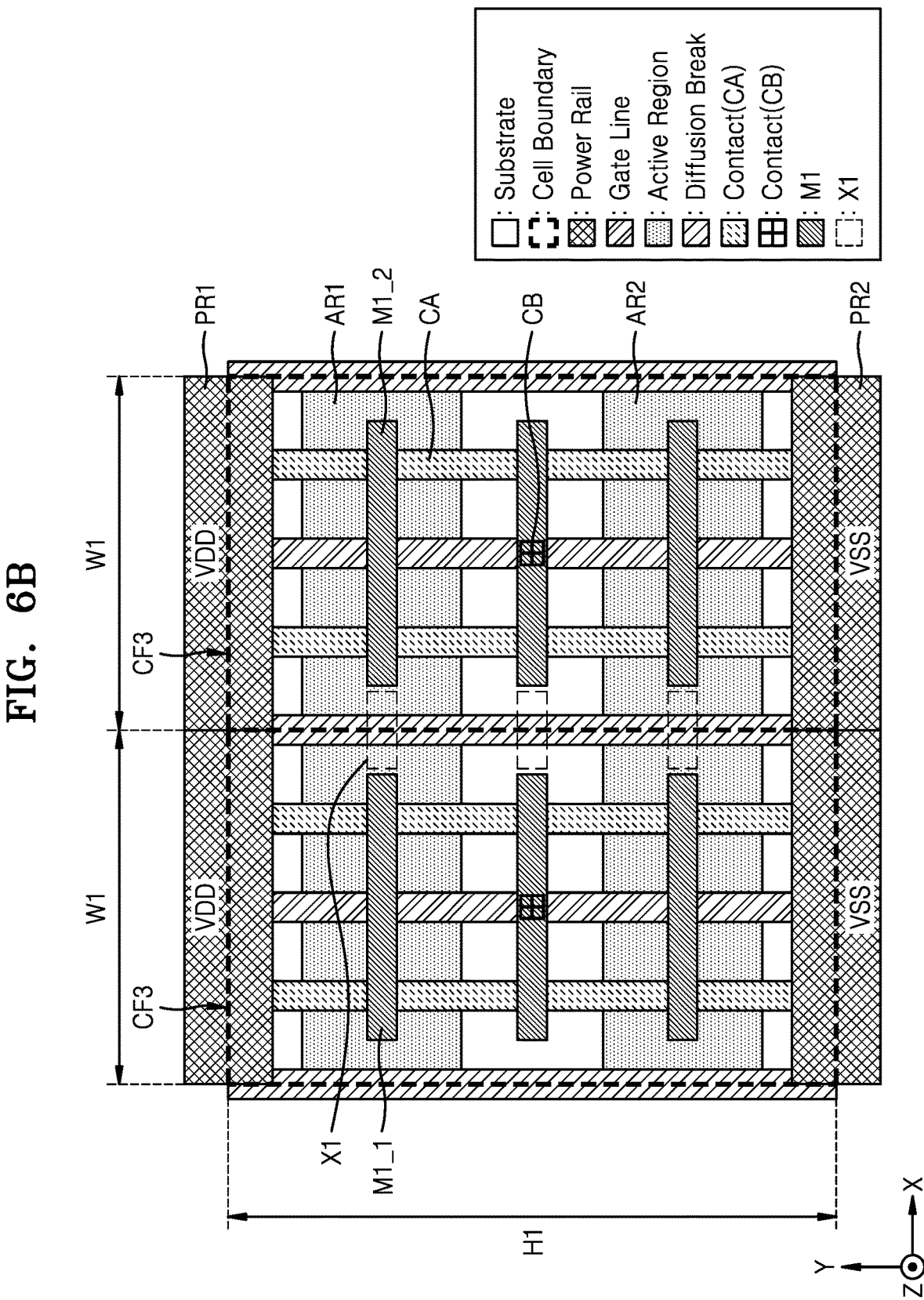
FIG. 6B is a diagram illustrating a layout of a filler cell included in an integrated circuit, according to an embodiment of the present disclosure.

FIGS. 6A and 6B are diagrams illustrating a layout of a filler cell included in an integrated circuit, according to an embodiment of the present disclosure.

In the description of FIGS. 6A and 6B, descriptions already given above with reference to FIG. 3A are omitted. A third filler cell CF3 shown in FIG. 6A has a similar structure to a structure of the first filler cell CF1 shown in FIG. 3A, and may further include at least one first metal pattern M1 or a gate contact CB to satisfy a density rule related to metal. In FIGS. 6A and 6B, for convenience of illustration, only some layers may be shown, and in order to indicate a connection between a pattern of a line layer and a sub-pattern, the gate contact CB may be shown even though the gate contact CB is arranged below the pattern of the line layer.

Referring to FIG. 6B, a cut X1 separating the first metal pattern M1 through a plurality of the third filler cell CF3 that are continuously arranged may be generated. According to embodiments, as an example, the first metal pattern may be separated into metal patterns M1_1 and M1_2.

For example, a plurality of filler cells may include a third filler cell (or a metal pattern filler cell) including a gate contact or patterns of a metal layer for adjusting a density of patterns formed in a standard cell. The plurality of filler cells may include third filler cells that are continuously arranged, and at least one metal cut may be arranged in a bonding surface of the continuously arranged third filler cells.

Figure 7A:
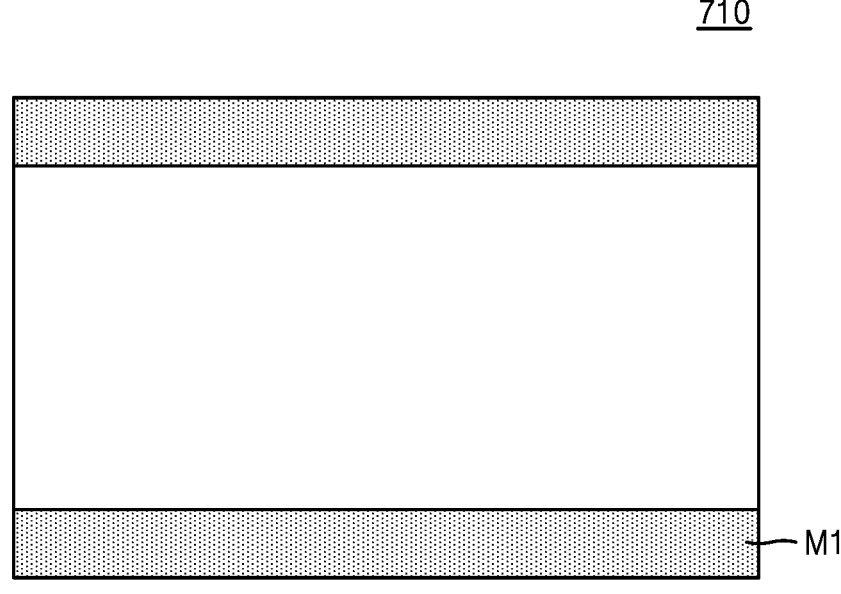
FIG. 7A is a diagram illustrating a layout of a filler cell included in an integrated circuit, according to an embodiment of the present disclosure.
Figure 7B:
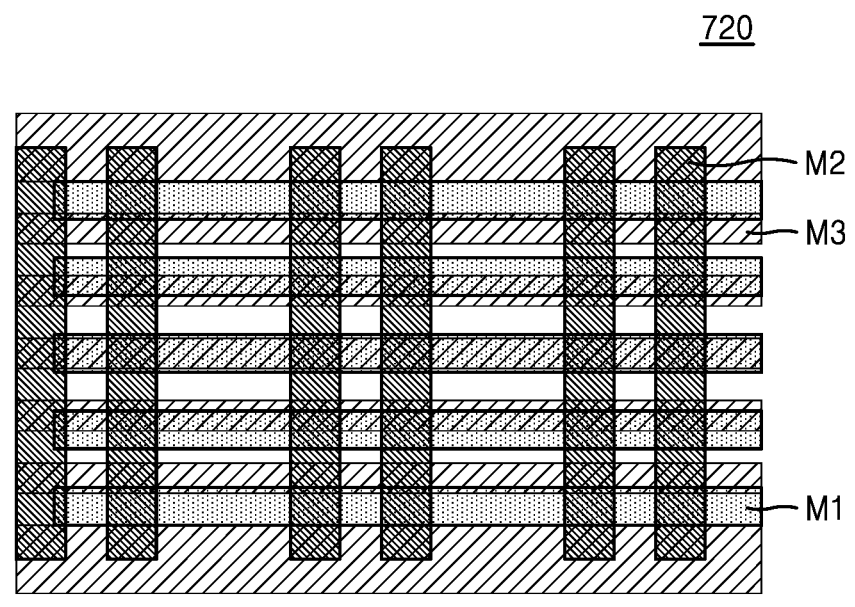
FIG. 7B is a diagram illustrating a layout of a filler cell included in an integrated circuit, according to an embodiment of the present disclosure.

FIGS. 7A and 7B are diagrams illustrating a layout of a filler cell included in an integrated circuit, according to an embodiment of the present disclosure.

FIG. 7A is a comparative example of the present disclosure and shows a filler cell 710 in which a BEOL pattern is not included.

Referring to FIG. 7B, a filler cell 720 may include a BEOL pattern including a first metal pattern M1, a second metal pattern M2, and a third metal pattern M3.

Figure 8:
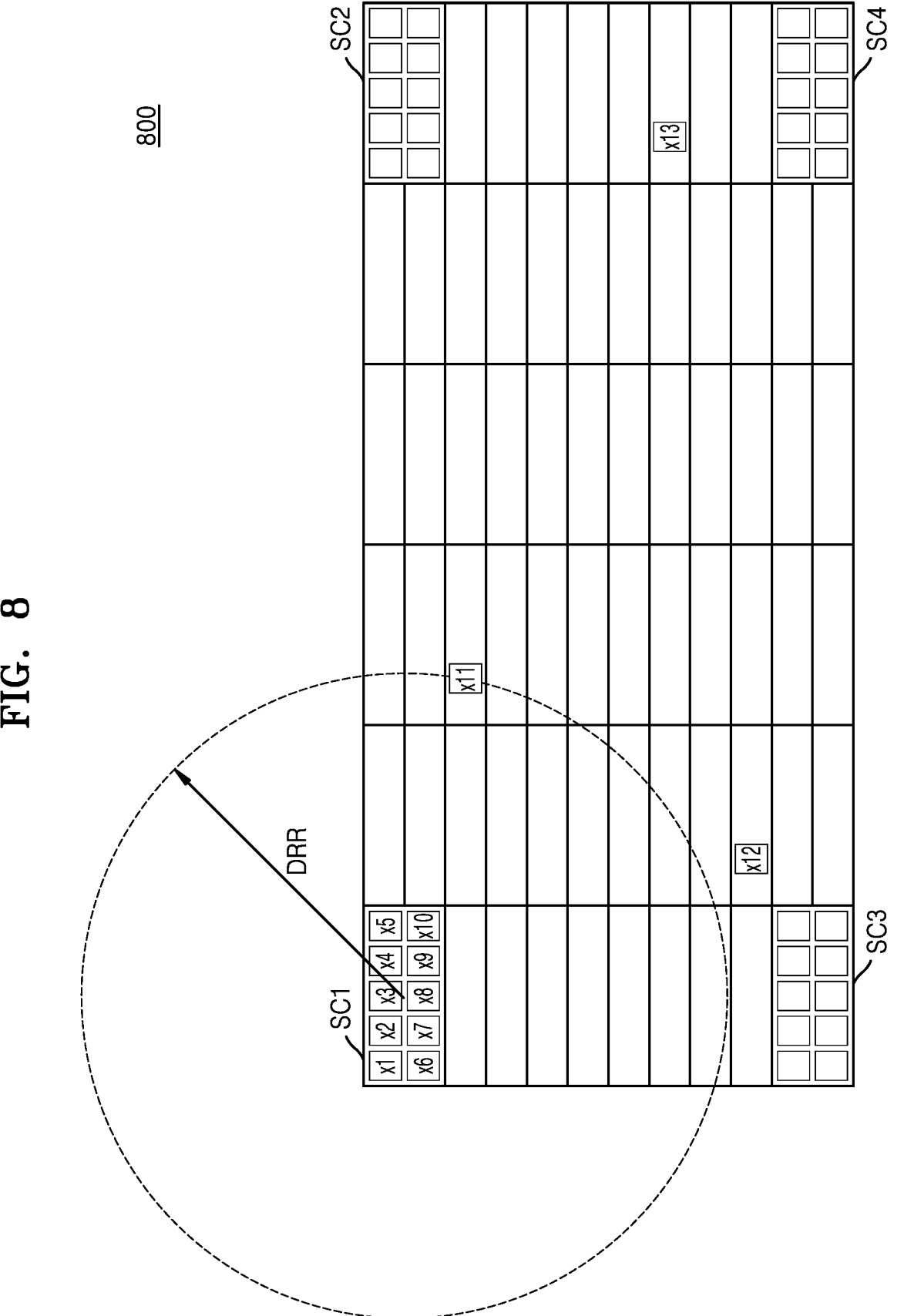
FIG. 8 is a diagram illustrating a layout of a filler cell included in an integrated circuit, according to an embodiment of the present disclosure.

FIG. 8 is a diagram 800 illustrating a layout of a filler cell included in an integrated circuit, according to an embodiment of the present disclosure.

During a process of designing an integrated circuit, because a metal cut (for example, an eleventh metal cut x11, a twelfth metal cut x12, and a thirteenth metal cut x13) may be randomly generated in a P&R stage, it may be difficult to satisfy a density rule for a metal cut within a specific range. For example, a density rule for a metal cut may require at least a reference number of metal cuts be included within a first radius DRR. To compensate for this, a density supplementary filler cell may be used.

Referring to FIG. 8, a density supplementary filler cell SC1 may be designed to include a plurality of metal cuts x1 to x10. In the P&R stage, when a plurality of density supplementary filler cells SC1, SC2, SC3, SC4, . . . are uniformly arranged, the density rule for the metal cut may be satisfied.

For example, the first filler cell and the second filler cell may include the same FEOL pattern, and the second filler cell may include at least a reference number of metal cuts set based on the density rule. In this case, the second filler cell may be a density supplementary filler cell. The second filler cell may be arranged at preset intervals in the first direction or the second direction perpendicular to the first direction.

Figure 9A:
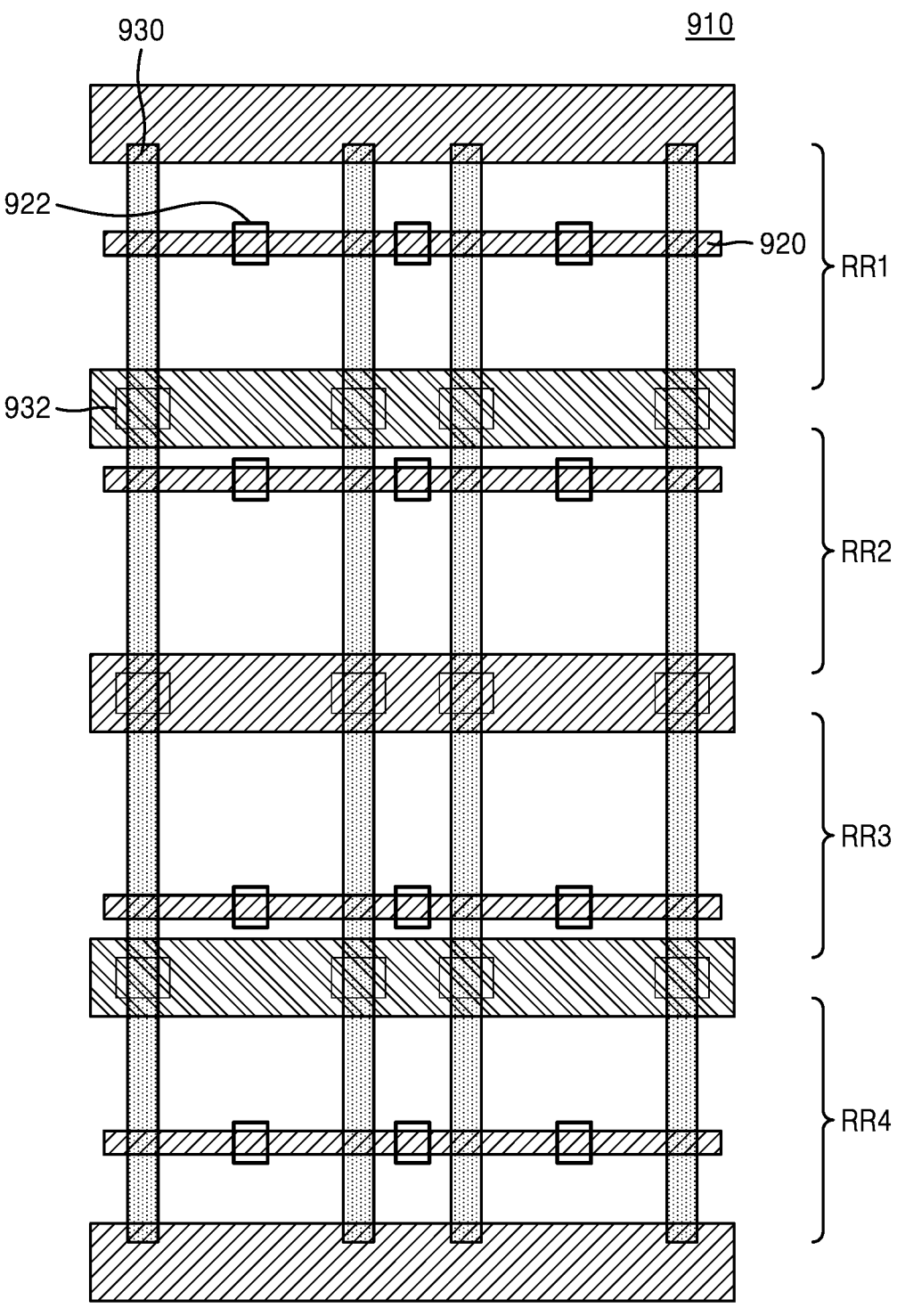
FIG. 9A is a diagram illustrating a layout of a filler cell included in an integrated circuit, according to an embodiment of the present disclosure.
Figure 9B:
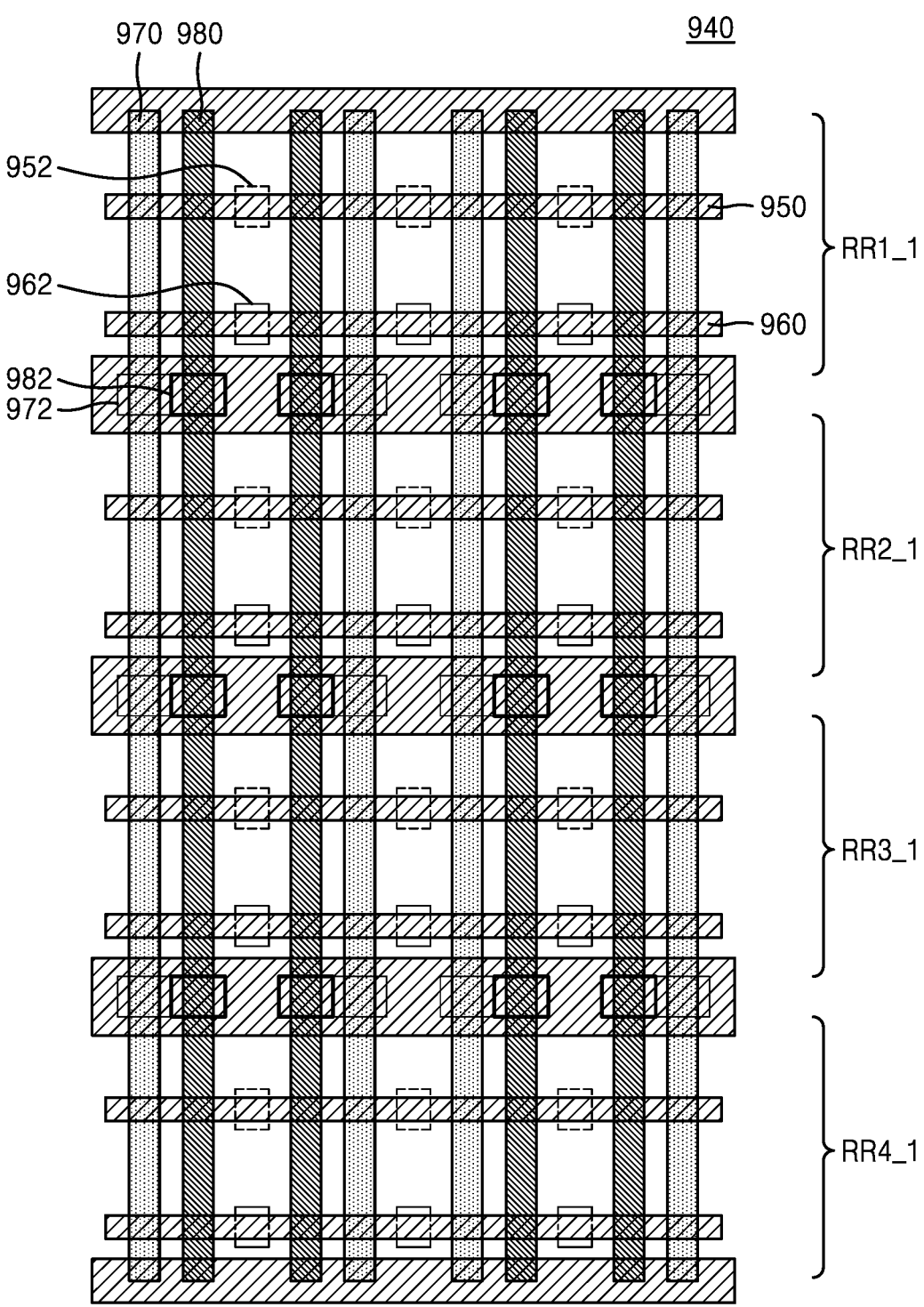
FIG. 9B is a diagram illustrating a layout of a filler cell included in an integrated circuit, according to an embodiment of the present disclosure.

FIGS. 9A and 9B are diagrams illustrating a layout of a filler cell included in an integrated circuit, according to an embodiment of the present disclosure.

A density rule for a metal cut may be satisfied through a multi-height structure filler cell including a plurality of metal cuts. The multi-height structure filler cell may be in a form in which filler cells designed to be arranged in a single row are continuously arranged.

Referring to FIG. 9A, a first multi-height structure filler cell 910 may be arranged over a first row RR1, a second row RR2, a third row RR3, and a fourth row RR4. The first multi-height structure filler cell 910 may include a first metal pattern 920 extending in the first direction and a second metal pattern 930 extending in a second direction perpendicular to the first direction. A plurality of first metal cuts 922 may be formed in the first metal pattern 920, and a plurality of second metal cuts 932 may be formed in the second metal pattern 930. Because the first multi-height structure filler cell 910 is arranged over a plurality of rows, the second metal pattern 930 may extend relatively long, and thus may include more second metal cuts 932.

Referring to FIG. 9B, a second multi-height structure filler cell 940 may be arranged over a first row RR1_1, second row RR2_1, a third row RR3_1, and a fourth row RR4_1. The second multi-height structure filler cell 940 may include a third metal pattern 950 and a fourth metal pattern 960 each extending in the first direction and a fifth metal pattern 970 and a sixth metal pattern 980 each extending in the second direction perpendicular to the first direction. A plurality of third metal cuts 952 may be formed in the third metal pattern 950, and a plurality of fourth metal cuts 962 may be formed in the fourth metal pattern 960. A plurality of fifth metal cuts 972 may be formed in the fifth metal pattern 970, and a plurality of sixth metal cuts 982 may be formed in the sixth metal pattern 980. Because the second multi-height structure filler cell 940 is arranged over a plurality of rows, the fifth metal pattern 970 and the sixth metal pattern 980 may each extend relatively long, and thus may include more fifth metal cuts 972 and sixth metal cuts 982, respectively.

For example, the first filler cell may be a multi-height structure filler cell. The first filler cell may be arranged over two or more consecutive rows, and may be arranged so that at least a reference number of metal cuts are included in a metal cut on which lines are formed, the lines extending in a direction perpendicular to the rows.

Figure 10A:
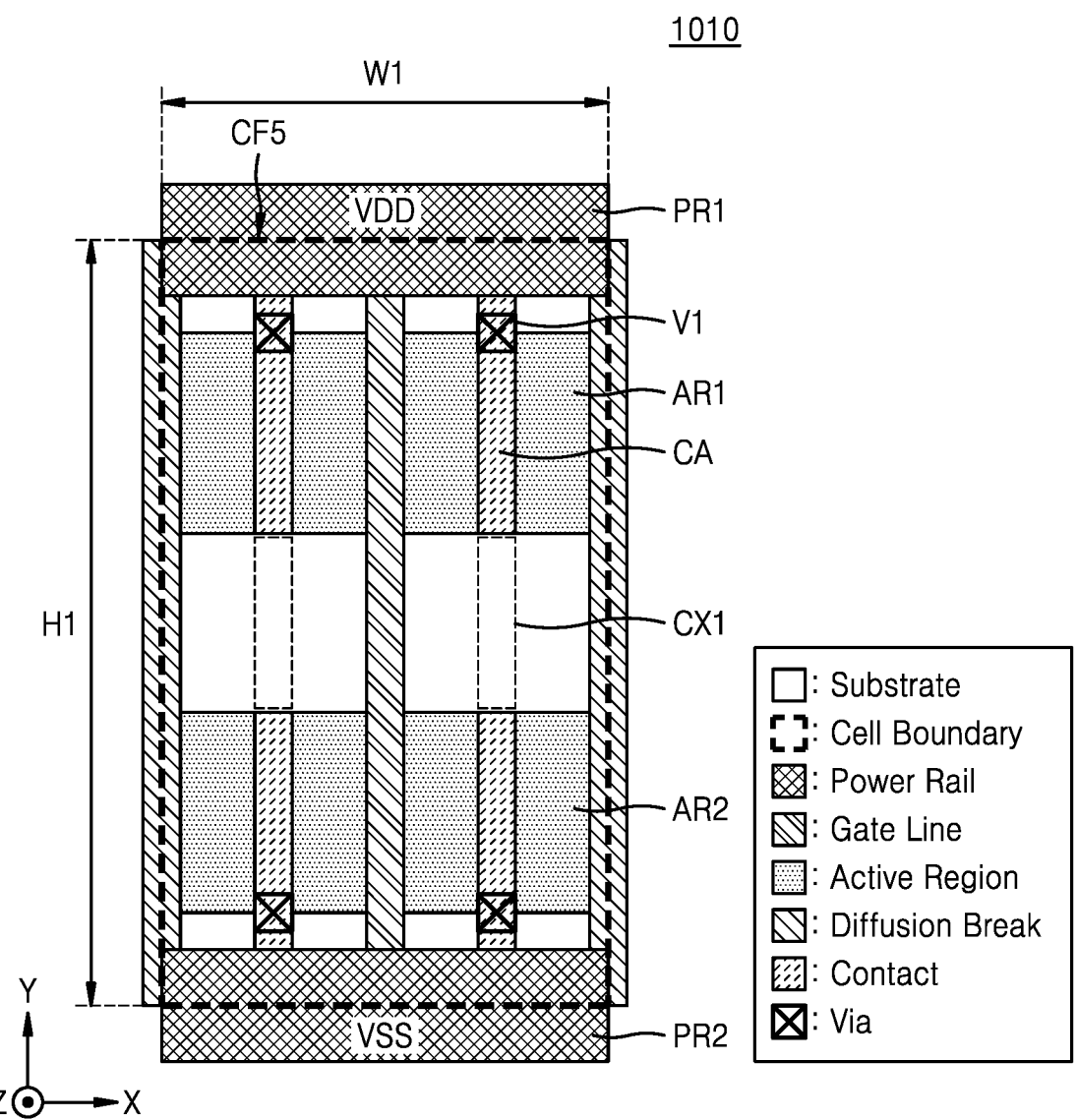
FIG. 10A is a diagram illustrating a layout of a filler cell included in an integrated circuit, according to an embodiment of the present disclosure.
Figure 10B:
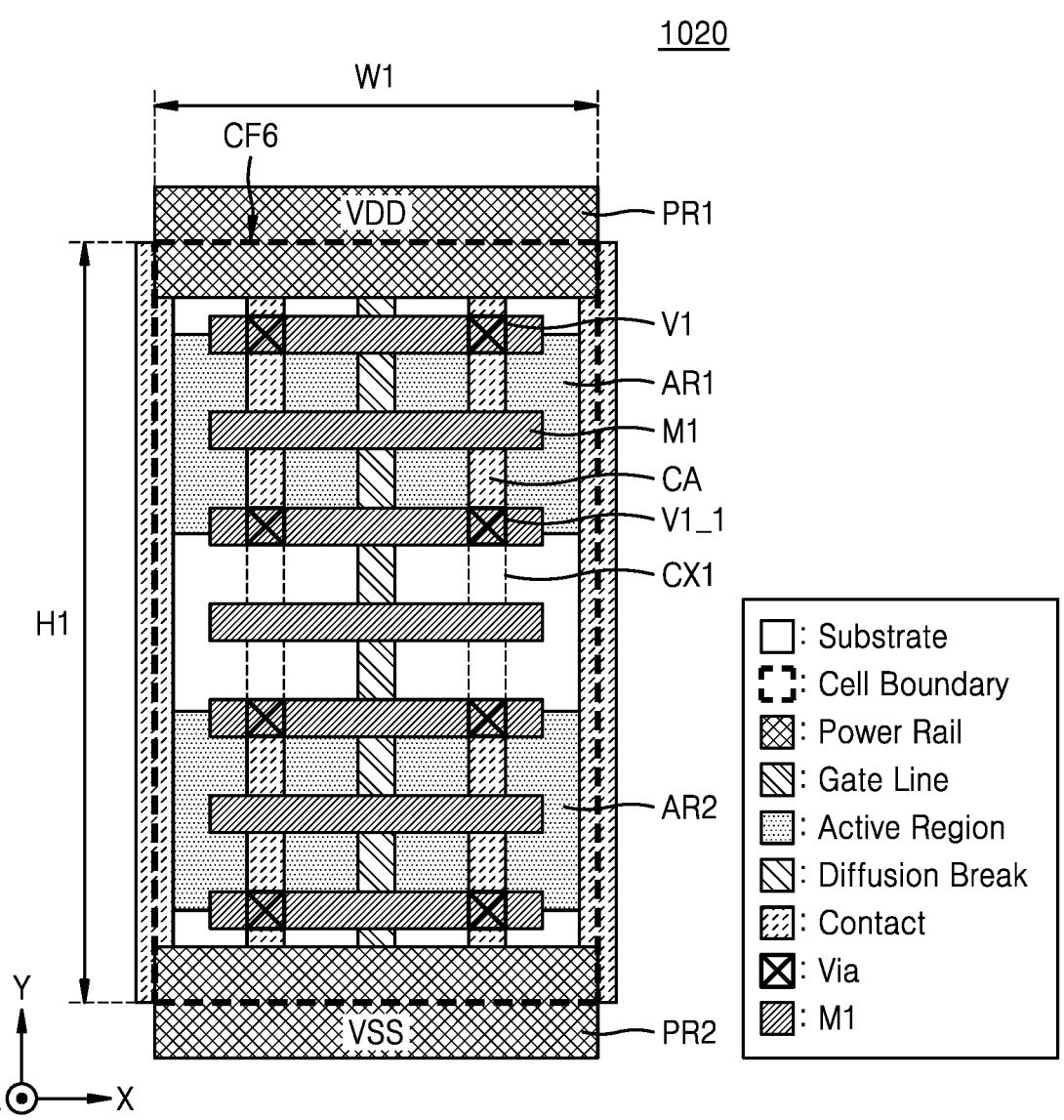
FIG. 10B is a diagram illustrating a layout of a filler cell included in an integrated circuit, according to an embodiment of the present disclosure.

FIGS. 10A and 10B are diagrams 1010 and 1020 illustrating a layout of a filler cell included in an integrated circuit, according to an embodiment of the present disclosure.

In the description of FIGS. 10A and 10B, descriptions already given above with reference to FIG. 3A are omitted. FIG. 10A is a comparative example of the present disclosure, and a fifth filler cell CF5 described with reference to FIG. 10A may have a structure in which the first filler cell CF1 described with reference to FIG. 3A further includes a first via V1. It may be difficult to satisfy the density rule solely by an MOL contact included in the fifth filler cell CF5. A sixth filler cell CF6 described with reference to FIG.

10B may further include a first via V1_1 and a first metal pattern M1 to satisfy a density rule.

Figure 11A:
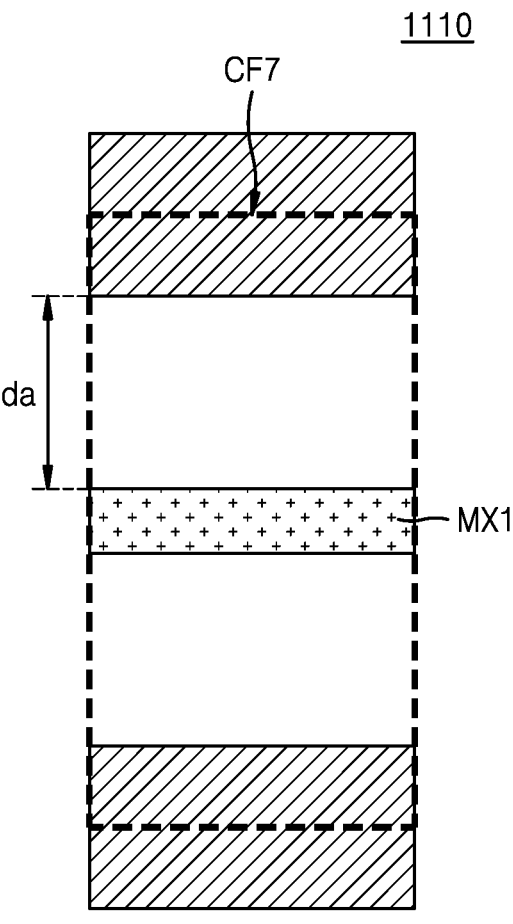
FIG. 11A is a diagram illustrating a layout of a filler cell included in an integrated circuit, according to an embodiment of the present disclosure.
Figure 11B:
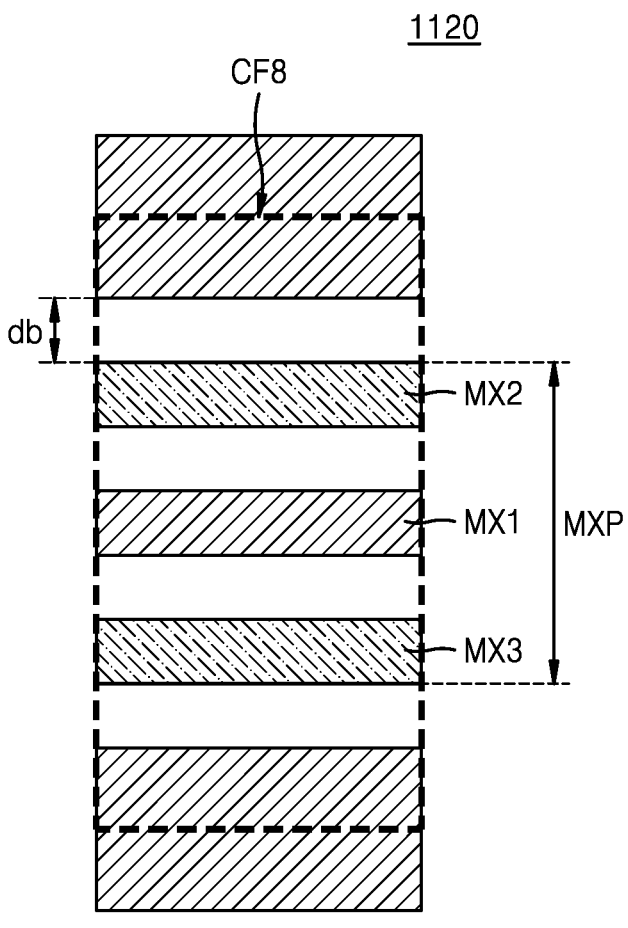
FIG. 11B is a diagram illustrating a layout of a filler cell included in an integrated circuit, according to an embodiment of the present disclosure.

FIGS. 11A and 11B are diagrams 1110 and 1120 illustrating a layout of a filler cell included in an integrated circuit, according to an embodiment of the present disclosure.

Referring to FIG. 11A, a seventh filler cell CF7 may include a first metal pattern MX1 at a position spaced apart by a first distance da from a power rail of the seventh filler cell CF7, but it may be difficult to insert an additional metal pattern after the P&R stage.

Referring to FIG. 11B, an eighth filler cell CF8 may include a dummy metal pattern MXP including a first metal pattern MX1, a second metal pattern MX2, and a third metal pattern MX3 that are spaced apart from each other by a distance db. In a design stage, the eighth filler cell CF8 may be pre-arranged to satisfy a density rule for a metal included in a BEOL pattern.

Figure 12:
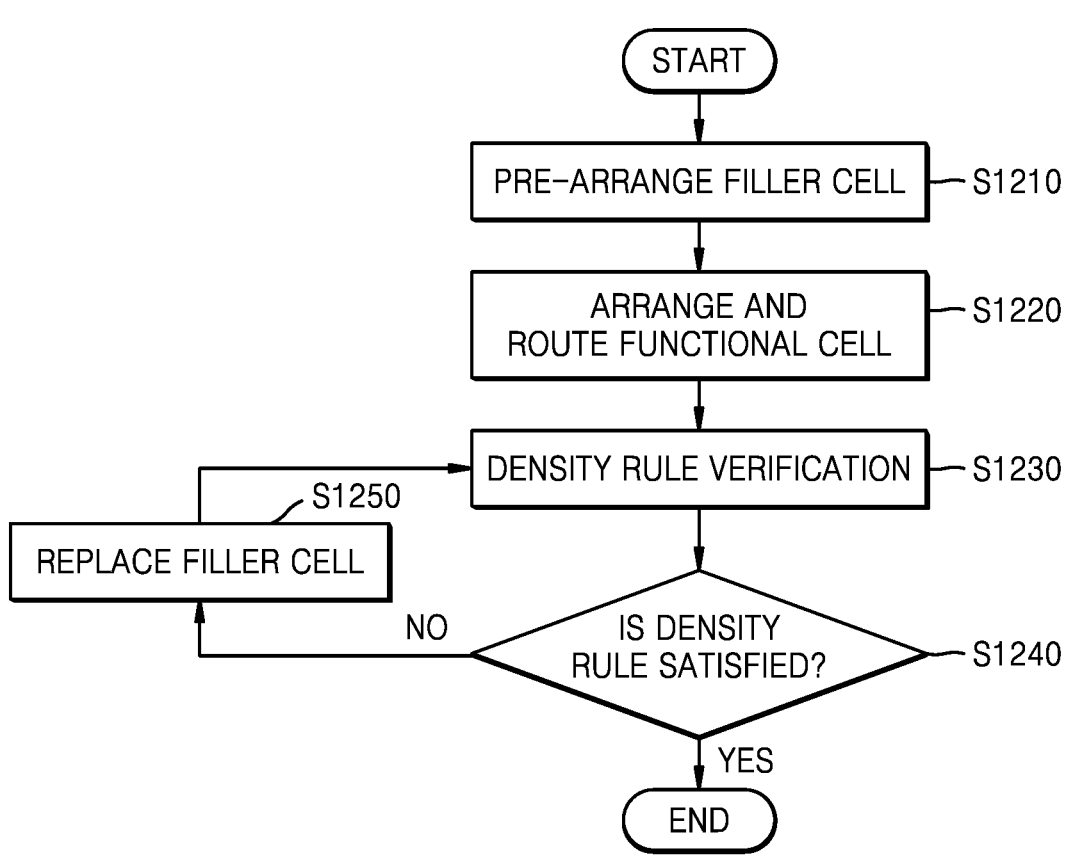
FIG. 12 is a flowchart of a method of fabricating an integrated circuit, according to an embodiment of the present disclosure.
Figure 13A:
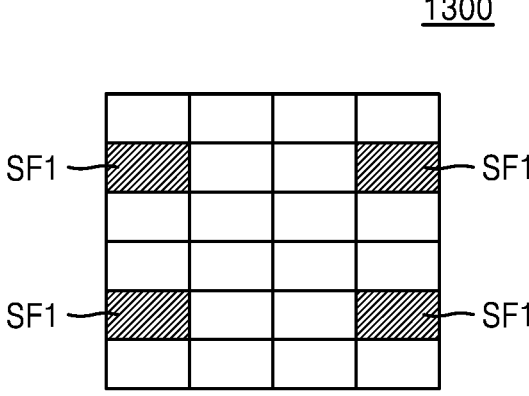
FIG. 13A is a first diagram illustrating an arrangement of filler cells in a method of fabricating an integrated circuit, according to an embodiment of the present disclosure.
Figure 13B:
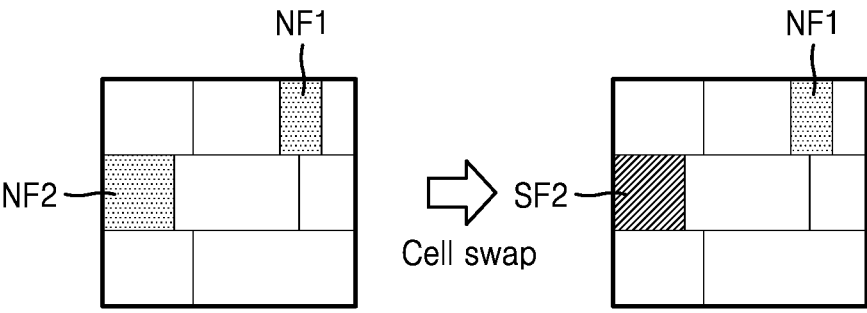
FIG. 13B is a second diagram illustrating the arrangement of filler cells in the method of fabricating the integrated circuit, according to an embodiment of the present disclosure.

FIG. 12 is a flowchart of a method of fabricating an integrated circuit, according to an embodiment of the present disclosure. FIGS. 13A and 13B are diagrams illustrating an arrangement of filler cells in a method of fabricating an integrated circuit, according to an embodiment of the present disclosure.

Referring to FIG. 12, a filler cell(s) may be pre-arranged at operation S1210. For example, density supplementary filler cells generated to satisfy a density rule of a specific pattern may be pre-arranged. When N or more metal cuts are to be included within a certain radius, the density supplementary filler cell may be generated to include N or more metal cuts, and may be uniformly arranged. For example, referring to FIG. 13A, an integrated circuit 1300 may include density supplementary filler cells SF1 that are uniformly arranged.

Referring again to FIG. 12, a P&R of functional cells may be performed at operation S1220. For example, a semiconductor design tool (for example, a P&R tool) may arrange a plurality of functional cells by referring to a standard cell library from netlist data. The semiconductor design tool may select one of layouts of a functional cell defined by netlist data by referring to a standard cell library, and arrange the selected layout of the functional cell.

At operation S1230, a density rule verification may be performed. For example, the verification may be performed by a DRC tool, and a density rule verification operation may be included in a DRC operation. Verification result data may be output as an output file from the DRC tool. The density rule verification operation may include, for example, a density rule verification operation of an FEOL pattern, a density rule verification operation of an MOL pattern, and a density rule verification operation of a BEOL pattern.

At operation 51240, when the density rule is satisfied, the method may be terminated, and when the density rule is not satisfied, the method may proceed to operation S1250.

At operation S1250, a replacement of a filler cell may be performed. Referring to FIG. 13B, when it is determined that a pattern does not satisfy a density rule, an arranged filler cell NF2 may be replaced with a filler cell SF2 having a high density of a corresponding pattern. After replacing the filler cell according to a result of the density rule verification performed, a density rule verification process may be repeatedly performed again at operation S1230.

Figure 14:
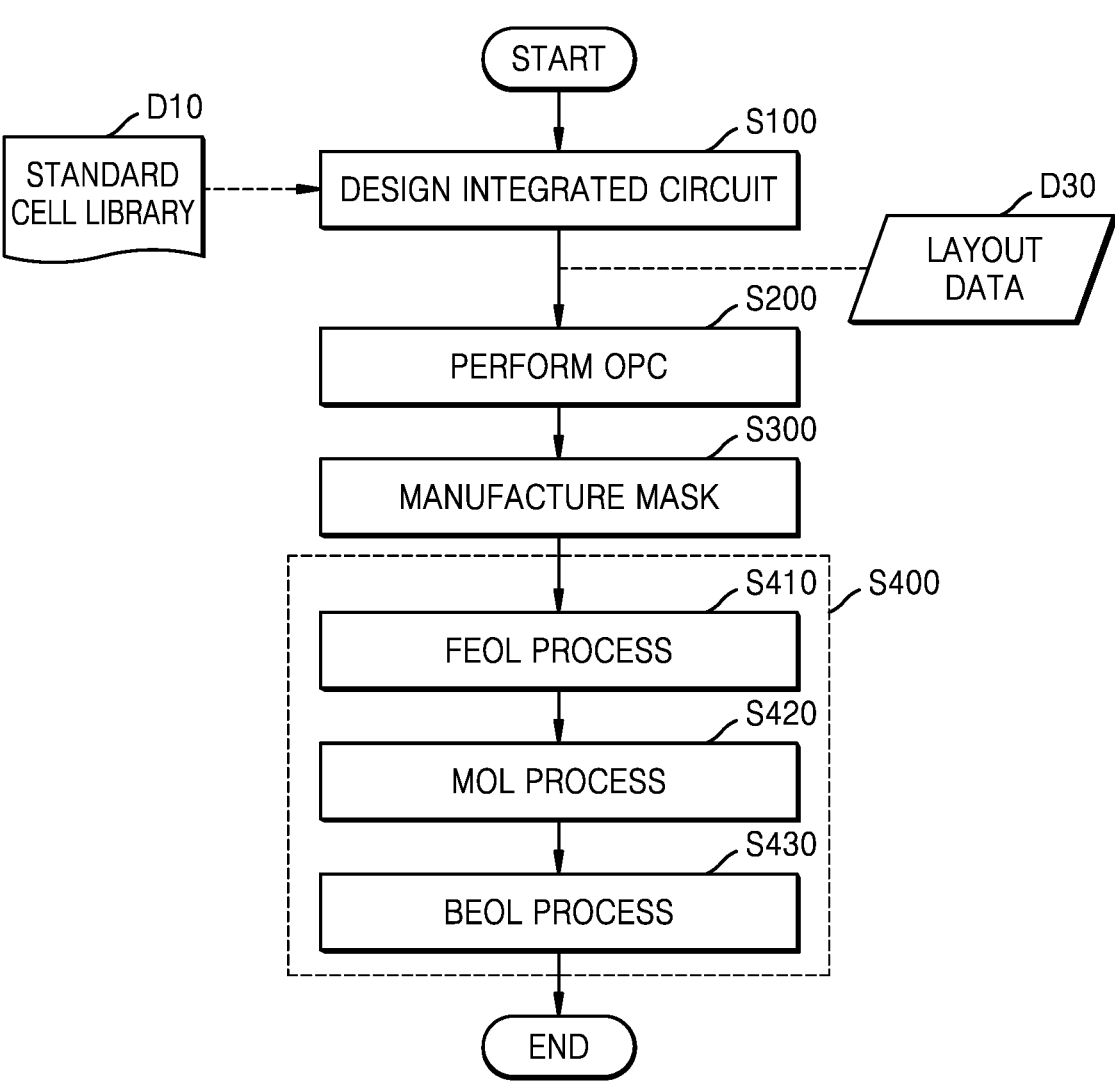
FIG. 14 is a flowchart of a method of fabricating an integrated circuit, according to an embodiment of the present disclosure.

FIG. 14 is a flowchart of a method for fabricating an integrated circuit, according to an embodiment of the present disclosure.

A standard cell library D10 may include information about a plurality of standard cells, for example, functional information, characteristic information, layout information, etc. For example, the standard cell library D10 may include information about at least one of filler cells of various types described with reference to FIGS. 3A to 11B.

Referring to FIG. 14, at operation S100, an operation of designing an integrated circuit may be performed, and layout data D30 may be generated. For example, the operation may be performed by a processor using a tool for designing an integrated circuit. In an example embodiment, operation S100 may include operations S10 to S40 of FIG. 1.

An optical proximity correction (OPC) may be performed at operation S200. The OPC may refer to an operation of forming a pattern having a desired shape by correcting a distortion phenomenon such as refraction due to characteristics of light in photolithography included in a semiconductor process for manufacturing an integrated circuit, and a pattern on a mask may be determined by applying the OPC to the layout data D30.

At operation S300, an operation of manufacturing a mask may be performed. For example, patterns formed in a plurality of layers according to the layout data D30 may be defined, and at least one mask (or photomask) for forming the patterns of the plurality of layers may be manufactured.

At operation S400, an operation of fabricating an integrated circuit may be performed. For example, an integrated circuit may be fabricated by patterning a plurality of layers using the at least one mask manufactured at operation S300. Operation S400 may include operations S410 to S430.

At operation S410, an FEOL process may be performed. The FEOL may refer to a process of forming, on a substrate, individual elements, for example, transistors, capacitors, resistors, etc., in a process of fabricating an integrated circuit. For example, an FEOL process may include planarizing and cleaning a wafer, forming a trench, forming a well, forming a gate line, forming a source and a drain, etc.

At operation S420, an MOL process may be performed. The MOL process may refer to a process of forming a connection member for connecting, within a standard cell, individual elements generated in the FEOL process. For example, the MOL process may include forming a contact in an active region, forming a via in a contact, and the like.

At operation S430, a BEOL process may be performed. The BEOL may refer to a process of connecting individual elements, for example, transistors, capacitors, resistors, etc., to each other in a process of fabricating an integrated circuit. For example, the BEOL process may include adding a metal layer, forming a via between metal layers, forming a passivation layer, a planarization step, and the like. Thereafter, the integrated circuit may be packaged in a semiconductor package, and may be used as a component of various applications.

While non-limiting example embodiments of the present disclosure have been particularly shown and described, it will be understood that various changes in form and details may be made to embodiments of the present disclosure without departing from the spirit and scope of the present disclosure.

What is claimed is:

1. An integrated circuit comprising standard cells arranged over a plurality of rows, wherein the standard cells comprise:
   a plurality of functional cells each implemented as a logic circuit; and
   a plurality of filler cells comprising at least one first filler cell and at least one second filler cell that each comprise at least one pattern from among a back end of line (BEOL) pattern, a middle of line (MOL) pattern, and a front end of line (FEOL) pattern, and
wherein the at least one first filler cell and the at least one second filler cell have a same size as each other, and a density of one of the at least one pattern of the at least one first filler cell is different from a density of one of the at least one pattern of the at least one second filler cell, and
wherein:
   the at least one first filler cell and the at least one second filler cell comprise a same BEOL pattern, and a density of a contact included in the at least one first filler cell is different from a density of a contact included in the at least one second filler cell; or
   the at least one first filler cell and the at least one second filler cell comprise a same FEOL pattern, and a density of a BEOL pattern included in the at least one first filler cell is different from a density of a BEOL pattern included in the at least one second filler cell; or
   the at least one first filler cell and the at least one second filler cell comprise a same FEOL pattern, and the at least one second filler cell comprises at least a reference number of metal cuts set based on a density rule.

2. The integrated circuit of claim 1, wherein the at least one first filler cell and the at least one second filler cell comprise the same BEOL pattern, and the density of the contact included in the at least one first filler cell is different from the density of the contact included in the at least one second filler cell.

3. The integrated circuit of claim 1, wherein the at least one first filler cell and the at least one second filler cell comprise the same FEOL pattern, and the density of the BEOL pattern included in the at least one first filler cell is different from the density of the BEOL pattern included in the at least one second filler cell.

4. The integrated circuit of claim 1, wherein the at least one first filler cell and the at least one second filler cell comprise the same FEOL pattern, and the at least one second filler cell comprises at least the reference number of metal cuts set based on the density rule.

5. The integrated circuit of claim 4, wherein the at least one second filler cell is a plurality of second filler cells that are arranged from each other at a preset interval in a first direction or a second direction perpendicular to the first direction.

6. An integrated circuit comprising standard cells arranged over a plurality of rows, wherein the standard cells comprise:
   a plurality of functional cells each implemented as a logic circuit; and
   a plurality of filler cells comprising at least one first filler cell and at least one second filler cell that each comprise at least one pattern from among a back end of line (BEOL) pattern, a middle of line (MOL) pattern, and a front end of line (FEOL) pattern, and
wherein the at least one first filler cell and the at least one second filler cell have a same size as each other, and a density of one of the at least one pattern of the at least one first filler cell is different from a density of one of the at least one pattern of the at least one second filler cell, and
wherein the at least one first filler cell is a plurality of first filler cells that are arranged over two or more consecutive rows, and comprise at least a reference number of metal cuts in a metal layer on which lines are provided, the lines extending in a direction perpendicular to an extending direction of the two or more consecutive rows.

7. An integrated circuit comprising standard cells arranged over a plurality of rows, wherein the standard cells comprise:

a plurality of functional cells each implemented as a logic circuit; and a plurality of filler cells comprising at least one first filler cell and at least one second filler cell that each comprise at least one pattern from among a back end of line (BEOL) pattern, a middle of line (MOL) pattern, and a front end of line (FEOL) pattern, and wherein the at least one first filler cell and the at least one second filler cell have a same size as each other, and a density of one of the at least one pattern of the at least one first filler cell is different from a density of one of the at least one pattern of the at least one second filler cell, wherein the at least one first filler cell comprises the MOL pattern, wherein the MOL pattern of the at least one first filler cell comprises a first contact cut extending in a first direction, the first contact cut having a first length in the first direction, wherein the at least one second filler cell comprises a second contact cut extending in the first direction, the second contact cut having a second length, and wherein the first length is different from the second length.

8. The integrated circuit of claim 7, wherein the at least one first filler cell further comprises a first active region comprising first source/drain contacts, and none of the first source/drain contacts are overlapped by the first contact cut, and the at least one second filler cell further comprises a second active region comprising second source/drain contacts, and at least one of the second source/drain contacts is overlapped by the second contact cut.

9. An integrated circuit comprising standard cells arranged over a plurality of rows, wherein the standard cells comprise:

a plurality of functional cells each implemented as a logic circuit; and a plurality of filler cells comprising at least one first filler cell and at least one second filler cell that each comprise at least one pattern from among a back end of line (BEOL) pattern, a middle of line (MOL) pattern, and a front end of line (FEOL) pattern, and wherein the at least one first filler cell and the at least one second filler cell have a same size as each other, and a density of one of the at least one pattern of the at least one first filler cell is different from a density of one of the at least one pattern of the at least one second filler cell, wherein the at least one first filler cell comprises a first contact cut extending in a first direction, the first contact cut having a first length, wherein the at least one second filler cell extends over a first section, a second section, and a third section in a second direction perpendicular to the first direction, and comprises a plurality of second contact cuts and a third contact cut, wherein each of the plurality of second contact cuts extends in the first direction and has the first length, and second contact cuts of the plurality of second contact cuts are respectively provided in the first section and the third section, wherein the third contact cut extends in the first direction and has a second length, and the third contact cut is provided in the second section, and wherein the first length is less than the second length.

10. An integrated circuit comprising standard cells arranged over a plurality of rows, wherein the standard cells comprise:

a plurality of functional cells each implemented as a logic circuit; and a plurality of filler cells comprising at least one first filler cell and at least one second filler cell that each comprise at least one pattern from among a back end of line (BEOL) pattern, a middle of line (MOL) pattern, and a front end of line (FEOL) pattern, and wherein the at least one first filler cell and the at least one second filler cell have a same size as each other, and a density of one of the at least one pattern of the at least one first filler cell is different from a density of one of the at least one pattern of the at least one second filler cell, wherein the plurality of filler cells further comprise at least one third filler cell comprising patterns of a metal layer or a gate contact for adjusting a density of a pattern formed on at least one of the standard cells wherein the at least one third filler cell is a plurality of third filler cells that are consecutively arranged, and wherein at least one metal cut is formed in a bonding surface of the plurality of third filler cells that are consecutively arranged.

* * * * *